(12) United States Patent
Kumasaka et al.

(10) Patent No.: US 6,686,597 B2
(45) Date of Patent: Feb. 3, 2004

(54) SUBSTRATE ROTATING DEVICE, AND MANUFACTURING METHOD AND APPARATUS OF RECORDING MEDIUM MASTER

(75) Inventors: Osamu Kumasaka, Koufu (JP); Kazumi Kuriyama, Koufu (JP); Hiroki Kaneda, Koufu (JP); Masami Sone, Koufu (JP); Kenji Kamimura, Koufu (JP); Takeharu Iwata, Koufu (JP); Masaki Kobayashi, Koufu (JP)

(73) Assignee: Pioneer Corporation, Tokyo (JP)

( * ) Notice: Subject to any disclaimer, the term of this patent is extended or adjusted under 35 U.S.C. 154(b) by 151 days.

(21) Appl. No.: 09/942,982

(22) Filed: Aug. 31, 2001

(65) Prior Publication Data
US 2002/0034152 A1 Mar. 21, 2002

(30) Foreign Application Priority Data

| Sep. 4, 2000 | (JP) | 2000-266578 |
| Sep. 14, 2000 | (JP) | 2000-280304 |
| Jul. 24, 2001 | (JP) | 2001-222606 |
| Jul. 24, 2001 | (JP) | 2001-222607 |
| Jul. 26, 2001 | (JP) | 2001-226299 |

(51) Int. Cl.$^7$ ................................................ C23F 1/00
(52) U.S. Cl. .............................. 250/492.2; 369/272
(58) Field of Search ............................. 369/272, 110; 346/147; 250/492.2; 428/65.3; 34/559; 318/649; 414/783

(56) References Cited

U.S. PATENT DOCUMENTS

2002/0033449 A1 * 3/2002 Nakasuji ................... 250/306

* cited by examiner

*Primary Examiner*—John R. Lee
*Assistant Examiner*—Phillip A Johnston
(74) *Attorney, Agent, or Firm*—McGinn & Gibb, PLLC

(57) ABSTRACT

A master disc manufacturing apparatus includes an electron-beam emitting portion for emitting an electron beam, an electron-beam converging portion for converging an electron beam, a retarding voltage applying portion for applying a substrate with a negative potential having a magnitude of decelerating the electron beam, and a vacuum atmosphere producing portion for evacuating a chamber to produce a vacuum atmosphere therein.

36 Claims, 18 Drawing Sheets

SUBSTRATE ROTATING DEVICE, AND MANUFACTURING METHOD AND APPARATUS OF RECORDING MEDIUM MASTER

BACKGROUND OF THE INVENTION

1. Field of the Invention

The present invention relates to a substrate rotating device and a manufacturing method and apparatus of a recording medium master.

2. Description of the Related Art

A variety of large-capacity recording media are under development for recording image/audio data and digital data thereon. An optical disc such as a DVD (Digital Versatile Disc) is one example of the recording media. Research and development are now under progress for increasing the recording capacity to, for example, 30 GB (Giga-Bytes) for the optical disc having a diameter of 12 cm. Also, a hard disk platter for magnetic recording having large capacity is also under development.

Recording resolution, however, is limited by the spot diameter of a laser beam for recording in the manufacturing process of a master (i.e., an original master or a stamper) of a recording medium using a conventional laser beam in a visible or ultraviolet wavelength range. Investigations have been made for manufacturing the master (i.e., cutting of the master) with a master manufacturing apparatus using an electron beam for increasing the recording density of the disc, since the electron beam has a smaller spot diameter than a visible or ultraviolet laser beam.

The manufacturing method of the master through exposure to the electron beam involves coating of a master-disc substrate (hereinafter, simply referred to as "substrate") with an electron beam resist, and irradiating the substrate with the electron beam in a vacuum environment. The electron beam is applied to form a latent image of miniature patterns (i.e., electron beam exposure) in the electron beam resist. The substrate undergoes a development, patterning and removal processing of the resist, resulting in formation of miniature concave/convex patterns on the substrate.

For achieving a high resolution in the electron beam exposure, the electron beam must be converged into a thin beam which however travels at a higher velocity. A fast electron beam is hardly absorbed in an electron beam resist layer but pass therethrough, thereby resulting in a reduced amount of exposure and a lower resolution.

It is contemplated to perform a constant angular velocity exposure in the electron beam method in which exposure (i.e., recording) is performed on a substrate rotated at a constant rotating speed, because of its simple control feature for a substrate rotating system. However, the line velocity greatly varies depending on a radial position of the substrate when the substrate is rotated at a constant angular velocity for exposure. For example, when using a substrate in which a recording radial position varies in a range of 20 to 60 mm (electron beam irradiation range), the line velocity varies approximately three times.

It is therefore necessary to control the velocity of the electron beam in accordance with variations in the line velocity. For example, when the velocity of the electron beam is changed by changing an accelerating voltage applied to an electron gun, the beam diameter also changes simultaneously, resulting in variations in the size of recorded pits, the width of grooves and so on. Further, the axis and focus of the electron beam also fluctuate by changing the accelerating voltage applied to the electron gun. On the other hand, there is a method to use a condenser lens to control the amount of the electron beam current. However, there arises a problem that the structure of the electron beam irradiating system becomes complicated.

The electron beam is used in a vacuum atmosphere since the electron beam has properties of greatly diffusing and attenuating in an atmospheric pressure and the existence of another medium on a beam propagation path is not preferred. Consequently, the electron gun, a substrate rotating device, a substrate transporting device are all accommodated in a vacuum chamber and used in a vacuum.

The driving devices must be extremely accurately controlled for positioning and driving the substrate, since the master manufacturing apparatus forms a latent image of miniature concave/convex patterns at an extremely small pitch on the substrate.

The substrate must be rotated with high accuracy when manufacturing a high-density master disc in a master manufacturing apparatus using the electron beam.

Also, when the substrate is fixed by a mechanical chucking mechanism, the center of the substrate is susceptible to shifting, thereby causing a lower accuracy.

For recording (cutting) information on a substrate for an information recording medium, the substrate is placed on a turntable, and an electron beam is emitted from an electron beam irradiating means to irradiate the surface of the substrate with the electron beam. In this event, since an electromagnetic motor is used as a substrate rotating device for applying the turntable with a rotating force, an electromagnetic field is generated near the motor. The electromagnetic field, however, adversely affects a direction of the emitted electron beam, thereby reducing a recording or cutting accuracy.

To solve this problem, there is disclosed in Japanese Patent No. 3040887 (Japanese Unexamined Patent Publication Kokai No. H06-131706), a master manufacturing apparatus in which an electromagnetic motor is surrounded by a magnetic shielding means in order to avoid the influence of an electromagnetic field generated by the motor to the electron beam.

In a substrate rotating device of a conventional master manufacturing apparatus, a spindle shaft is supported by a static pressure air bearing in a housing, and rotated by a motor. A magnetic fluid seal is provided in a gap along the radial direction between the housing and the spindle shaft for blocking air for the bearing from a vacuum chamber.

In the conventional substrate rotating device, heat generated from a magnetic fluid seal and a motor transfers to a spindle shaft and its surroundings when it is used at a high rotational speed. The heat thus generated causes the spindle shaft to expand thermally and the shaft length to change. This results in a change in the height of a turntable attached on the shaft for carrying the substrate, leading to unstable focusing of an electron beam which should be converged on the substrate. In addition, the temperature distribution fluctuates in the magnetic fluid, causing unstable rotation of the spindle shaft. Consequently, the recording accuracy is deteriorated such as variations in track pitch of a resulting master and an increased amount of jitter in a reproduced signal.

Likewise, miniature patterns are formed through exposure of an electron beam or direct drawing with the electron beam in the manufacturing process of a master for magnetically recording hard discs. The rotation driving system and electron beam must be controlled with high accuracy in the manufacturing process of the master for forming miniature patterns using the electron beam.

OBJECT AND SUMMARY OF THE INVENTION

The present invention is made in view of the problems mentioned above, and the object of the present invention is to provide a highly-accurate substrate rotating device, and a master manufacturing apparatus and a method which are capable of manufacturing a high-density master disc.

It is another object of the present invention to provide a substrate rotating device which suppresses the influence of variations in temperature during driving, and a master manufacturing apparatus using the same.

To achieve the object, according to one aspect of the present invention, there is provided an apparatus for manufacturing a master of a recording medium by irradiation of an electron beam on a substrate placed on a turntable disposed within a chamber, which comprises an electron-beam emitting portion for emitting the electron beam; an electron-beam converging portion for converging the electron beam; a retarding voltage applying portion for applying the substrate with a retarding voltage having a magnitude of decelerating electron rays of the electron beam; and a vacuum atmosphere producing portion for evacuating the chamber to produce a vacuum atmosphere therein.

According to another aspect of the present invention, there is provided an apparatus for manufacturing a master of a recording medium by irradiation of an electron beam on a substrate, which comprises an electron-beam emitting portion for emitting the electron beam; an insulating turntable for supporting the substrate on a supporting surface thereof, the turntable having a throughhole; a spindle housing; a spindle shaft rotatably supported by the spindle housing through an air bearing, and having one end fixed to the turntable; a motor for rotating the spindle shaft; and an electron beam decelerating portion for applying the substrate with a retarding voltage of a magnitude of decelerating the electron beam, wherein the electron beam decelerating portion includes a conductive member which is urged such that the conductive member can project and retract from and into the supporting surface through the throughhole of the turntable, and a relay portion for relaying the retarding voltage to the conductive member through a rotary connector.

According to another aspect of the present invention, there is provided a substrate rotating device which comprises an insulating turntable for carrying a substrate thereon; a spindle housing; a spindle shaft rotatably supported by the spindle housing through an air bearing and having one end fixed to the turntable; a motor for rotating the spindle shaft; and an electrostatic chucking portion for attracting the substrate to the turntable, wherein the electrostatic chucking portion includes a chucking electrode disposed in the turntable, a power supply cable for supplying a chucking voltage to the chucking electrode through the spindle shaft, and a rotary connector for supplying the chucking voltage to the power supply cable.

According to another aspect of the present invention, there is provided an apparatus for manufacturing a master of a recording medium by irradiation of an electron beam on a substrate, which comprises an electron-beam emitting portion for emitting the electron beam; a substrate rotating device including an insulating turntable for supporting the substrate on a supporting surface thereof, the turntable having a throughhole, a spindle housing, a spindle shaft rotatably supported by the spindle housing through an air bearing and having one end fixed to the turntable, and a motor for rotating the spindle shaft; a translation driving portion for translating the rotation driving portion relative to the electron-beam emitting portion; and an electrostatic chucking portion for attracting the substrate to the turntable, wherein the electrostatic chucking portion includes a chucking electrode disposed in the turntable, a power supply cable installed in the spindle shaft for supplying a chucking voltage to the chucking electrode, and a rotary connector for supplying the chucking voltage to the power supply cable.

According to another aspect of the present invention, there is provided an apparatus for manufacturing a master of a recording medium by irradiation of an electron beam on a substrate placed on a turntable disposed in a chamber, which comprises an electron beam emitting portion for emitting the electron beam; an electron beam converging portion for converging the electron beam; an electron beam decelerating portion for applying the substrate with a retarding voltage of a magnitude of decelerating the electron beam; and a vacuum atmosphere producing portion for evacuating the chamber to produce a vacuum atmosphere therein, wherein the turntable has an adjacent region adjacent to an outer edge of the substrate placed on the turntable and the adjacent region has a predetermined resistance value lower than the vacuum atmosphere.

According to another aspect of the present invention, there is provided an apparatus for manufacturing a master of a recording medium by irradiation of an electron beam on a substrate placed on a turntable disposed in a chamber, comprising: an electron-beam emitting portion for emitting the electron beam; an electron-beam converging portion for converging the electron beam; a retarding voltage applying portion for applying the substrate with a retarding voltage of a magnitude of decelerating the electron beam; a vacuum atmosphere producing portion for evacuating the chamber to produce a vacuum atmosphere therein; and an adjacent ring having a predetermined resistance value lower than the vacuum atmosphere and adjoining to the substrate placed on the turntable.

According to another aspect of the present invention, there is provided a method of manufacturing a master of a recording medium by irradiation of an electron beam on a substrate placed on a turntable disposed in a chamber, which comprises the steps of evacuating the chamber to a vacuum; applying a substrate placed on the turntable with a retarding voltage of a magnitude of decelerating the electron beam; and converging the electron beam to irradiate the substrate with the converged electron beam.

According to another aspect of the present invention, there is provided an apparatus for manufacturing a master by irradiation of an electron beam on a substrate having a resist formed on a principal surface thereof, which comprises an electron gun; an accelerating voltage applying portion for applying the electron gun with an accelerating voltage to emit an electron beam; a rotation driving portion for rotating the substrate substantially at a constant angular velocity; a movement driving portion for relatively moving an irradiation position of the electron beam in a rotational radial direction of the substrate; an electron beam decelerating portion for applying the substrate with a retarding voltage having a magnitude of decelerating electron rays of the electron beam; and a controller for varying the electron beam retarding voltage in accordance with the irradiation position of the electron beam in the rotational radial direction of the substrate while maintaining the accelerating voltage substantially constant.

According to another aspect of the present invention, there is provided a substrate rotating device comprising a housing, a spindle shaft accommodated in the housing with one end thereof exposed from the housing, the spindle shaft being rotatably supported by a bearing, a motor for driving the spindle shaft, and a magnetic fluid seal intervening between the housing and the spindle shaft, the substrate rotating device for use in a vacuum atmosphere, which comprises temperature sensors and electric heaters disposed near the magnetic fluid seal and the motor; and a temperature controller for controlling the electric heaters based on outputs of the temperature sensors.

According to another aspect of the present invention, there is provided a master manufacturing apparatus using a substrate which comprises a substrate rotating device for rotating the substrate; an electron beam emitting portion including a deflecting portion for controlling deflection of an electron beam and a focus control portion for converging the electron beam to irradiate a principal surface of the substrate with the converged electron beam; and a movement driving portion for relatively moving the substrate rotating device and the electron beam emitting portion in a radial direction of the substrate, wherein the substrate rotating device has a housing; a spindle shaft accommodated in the housing with at least one end thereof exposed from the housing and rotatably supported by a static pressure air bearing; a motor for rotating the spindle shaft; a magnetic fluid seal intervening in a gap between the housing and the spindle shaft; temperature sensors and electric heaters disposed near the magnetic fluid seal and the motor; and a temperature controller for controlling the electric heaters based on the outputs of the temperature sensors.

DETAILED DESCRIPTION OF THE EMBODIMENTS

Figure 1:
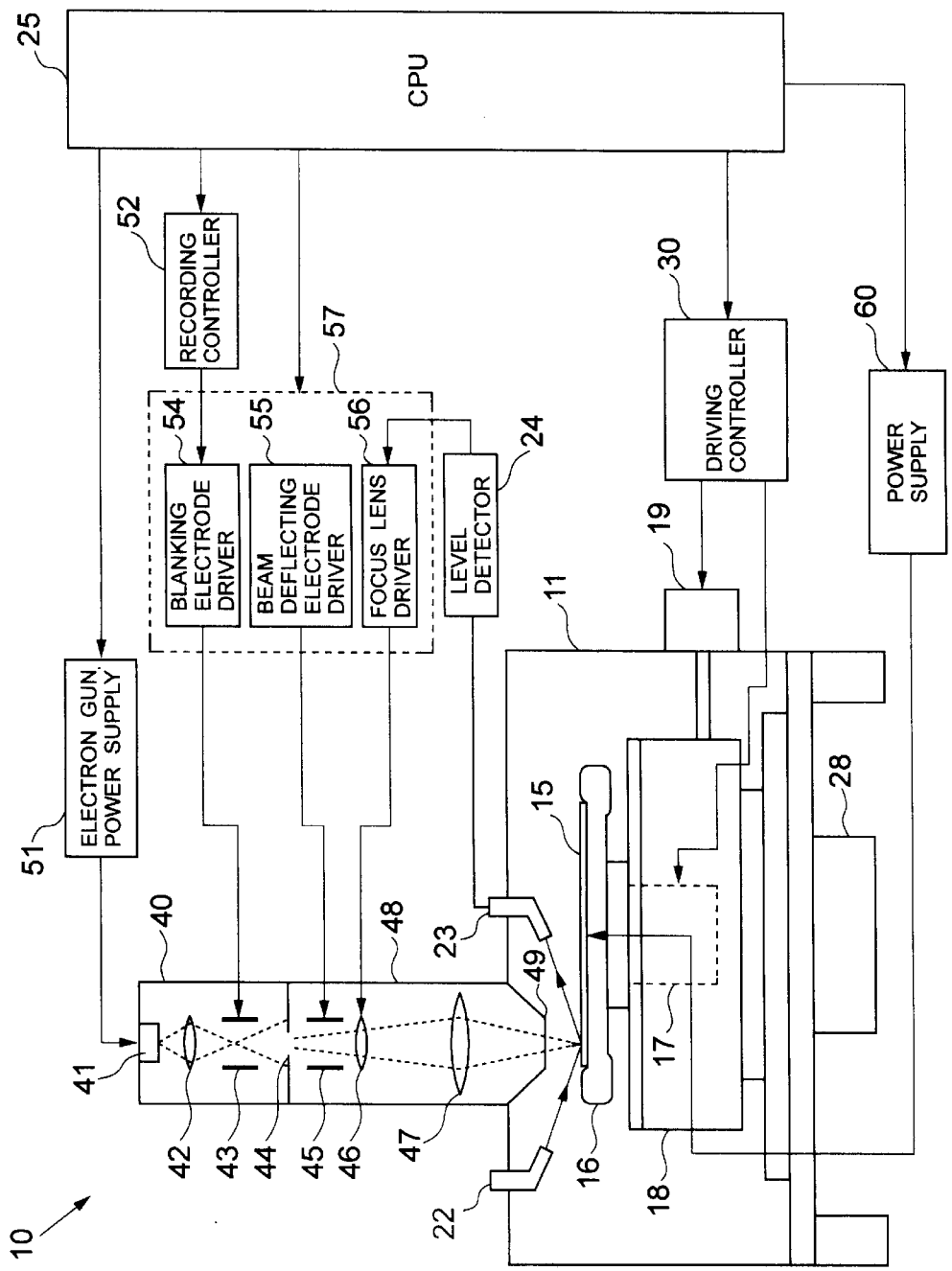
FIG. 1 is a block diagram illustrating the configuration of a master manufacturing apparatus using an electron beam according to a first embodiment of the present invention.

Embodiments of the present invention will now be described in detail with reference to the accompanying drawings. In the drawings used in the following description, similar components are designated the same reference numerals.

First Embodiment

FIG. 1 is a block diagram illustrating the configuration of a master (or a stamper) manufacturing apparatus 10 using an electron beam according to a first embodiment of the present invention.

A manufacturing process will be outlined below for a master of an optical disc as an example. The electron beam is used in a vacuum since an electron beam has the properties of greatly attenuating in the atmospheric pressure. Therefore, an electron gun, a turntable for holding a substrate thereon for fabricating a master, and so on are disposed in a vacuum.

For manufacturing a master, for example, a silicon (Si) plate is used as a substrate. The silicon substrate is coated with an electron beam resist on the principal surface. The substrate coated with the electron beam resist is rotated, and irradiated with an electron beam modulated by an information data signal to spirally form a latent image of miniature concave/convex patterns such as pits and grooves in a master manufacturing apparatus 10.

The substrate is removed from the master manufacturing apparatus 10 after the electron beam exposure is terminated, and then is developed. The substrate undergoes patterning and removal processing of the resist to form miniature concave/convex patterns on the substrate. The patterned substrate is formed with a conductive film on the principal surface thereof and then undergoes electroforming. Thus, a master of an optical disc is fabricated.

As illustrated in FIG. 1, the master manufacturing apparatus 10 comprises a vacuum chamber 11 which includes a driving unit for driving a substrate placed in the vacuum chamber 11, and an electron beam emitting head 40 mounted on the vacuum chamber 11 which includes an electron beam system.

A substrate 15 for an optical disc master is held on a turntable 16. The turntable 16 is rotated about a vertical axis of the principal surface of the substrate by an air spindle motor 17, which is a rotating device for rotating the substrate 15. The air spindle motor 17 is accommodated in a feed stage (hereinafter, simply called the "stage") 18. The stage 18 is coupled to a feed motor 19, which is a driving device for a translational motion, so that it can translate the air spindle motor 17 and the turntable 16 in a predetermined direction in a plane parallel to the principal surface of the substrate 15. The turntable 16 is made of a dielectric material, for example, ceramic or the like, and the substrate 15 is held on the turntable 16 by an electrostatic chucking mechanism, later described.

The vacuum chamber 11 is also provided with a light source 22, a photodetector 23 and a level detector 24 for detecting the level of the principal surface of the substrate 15. The photodetector 23, which includes, for example, a position sensor, CCD (Charge Coupled Device) or the like, receives a light beam emitted from the light source 22 and reflected from the surface of the substrate 15, and supplies a light receiving signal to the level detector 24. The level detector 24 detects the level of the principal surface of the substrate 15 based on the light receiving signal.

The vacuum chamber 11 is installed by way of a vibration isolator (not shown) such as an air damper to suppress transmission of external vibrations. Also, the vacuum chamber 11 is connected to a vacuum pump 28 which evacuates the vacuum chamber 11 such that the chamber is set in a vacuum of a predetermined pressure.

A driving controller 30 is also provided for controlling the air spindle motor 17 and the feed motor 19. The driving controller 30 operates under control of a main controller (CPU) 25 which controls the master manufacturing apparatus 10.

The electron beam emitting head 40 for emitting an electron beam comprises an electron gun 41, a converging lens 42, blanking electrodes 43, an aperture 44, beam deflecting electrodes 45, a focus adjusting lens 46, and an objective lens 47 disposed in this order in the electron beam emitting head 40. The electron beam emitting head 40 has an electron beam emitting port 49 formed at a leading end of the electron gun cylinder 48, oriented to a space within the vacuum chamber 11. The electron beam emitting head 40 is attached on the ceiling surface of the vacuum chamber 11. Also, the electron beam emitting port 49 is formed opposite to a position near the principal surface of the substrate 15 on the turntable 16.

The electron gun 41 emits an electron beam accelerated to, for example, several tens of KeV by a cathode (not shown) which is applied with a high voltage supplied from an electron gun power supply 51. The converging lens 42 converges the emitted electron beam and leads the converged electron beam to the aperture 44. A blanking driving unit 54 operates based on a signal from a recording controller 52 to control the blanking electrodes 43 for controlling the electron beam between on and off operation. Specifically, the blanking driving unit 54 applies a voltage across the blanking electrodes 43 to greatly deflect the electron beam passing therethrough. In this way, the electron beam is not converged on the iris hole of the aperture 44, i.e., blocked to pass through the aperture 44, so that the electron beam is controlled to be off.

A beam deflection driving unit 55 deflects the electron beam passing through the beam deflecting electrodes 45 by applying the electrodes 45 with a voltage in response to a control signal from the CPU 25. In this way, the position of the electron beam spot is controlled with respect to the substrate 15. A focus lens driving unit 56 adjusts the focus of the electron beam spot irradiating the principal surface of the substrate 15 based on a detection signal from the level detector 24.

As described above, if an electron beam impinges on a resist layer formed on the substrate 15 at a high velocity when a cutting (i.e., electron beam exposure) of the substrate 15 is performed, the electron beam will go through the resist layer, thereby causing a reduced amount of exposure and a lower resolution. To solve this problem, according to the present invention, the substrate 15 is applied with a retarding voltage ($V_R$) which is a negative voltage having a magnitude that decelerates electron rays of the electron beam. The application of the retarding voltage is referred to as a "retarding method" in the following description. A voltage source 60 is provided for applying the retarding voltage and a chucking voltage. For example, the retarding voltage is set at −40 kV when an electron beam accelerating voltage is 50 kV. The magnitude of the retarding voltage may be determined as appropriate in accordance with the electron beam accelerating voltage, the sensitivity characteristic of the resist layer, a resolution required for the master, and so on.

A mechanism for applying the substrate 15 with the retarding voltage, and an electrostatic chucking mechanism for the substrate 15 will be described in detail with reference to FIGS. 2 through 4B.

Figure 2:
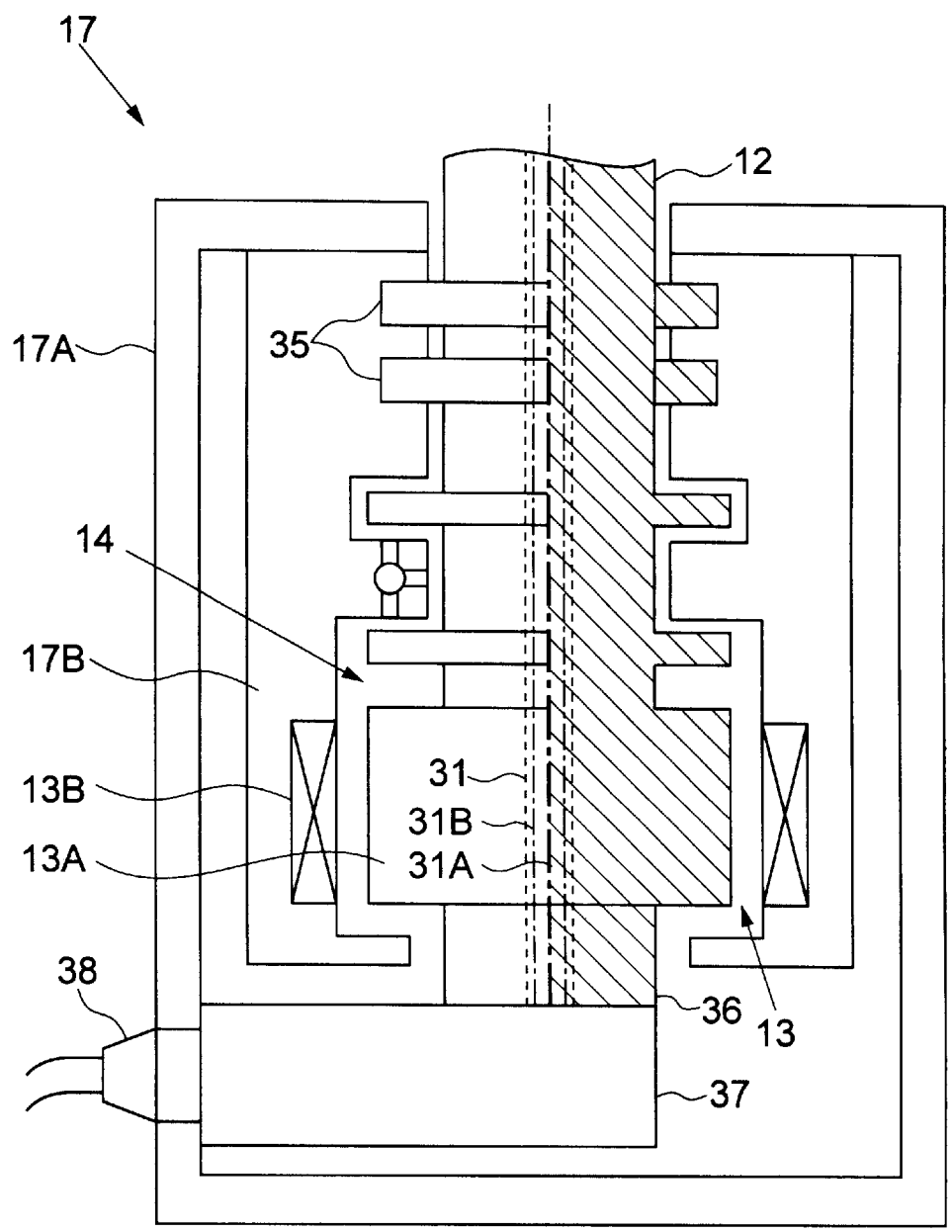
FIG. 2 is a cross-sectional view schematically illustrating the internal structure of a spindle housing which includes an air spindle motor and a high voltage supplying portion of the master manufacturing apparatus illustrated in FIG. 1.

FIG. 2 is a cross-sectional view schematically illustrating the internal structure within a spindle housing 17A which encloses an electromagnetic motor 13 and a high voltage supplying portion 37 of the master manufacturing apparatus 10 illustrated in FIG. 1.

A spindle shaft 12 and the electromagnetic motor 13 for rotating the spindle shaft 12 are accommodated in the spindle housing 17A of the air spindle motor 17. The spindle shaft 12 is rotatably supported by the spindle housing 17A through an air bearing 14, and has one end fixed to the turntable 16. In this embodiment, a pressure seal (magnetic fluid seal) 35 is provided to surround the spindle shaft 12 such that the pressure seal 35 interposes in a gap in the radial direction between an opening of the spindle housing 17A and the spindle shaft 12. The magnetic fluid seal 35 serves as an airtight seal within the spindle housing 17A. The spindle housing 17A and the spindle shaft 12 are electrically connected to the apparatus body (i.e., the vacuum chamber 11) by way of the magnetic fluid seal 35. Thus, the spindle housing 17A and the spindle shaft 12 are grounded.

A motor body 13A for rotating the spindle shaft 12 is attached to the spindle shaft 12 within the spindle housing 17A. The spindle shaft 12 can be rotated making use of an electromagnetic force generated by supplying a current to a coil 13B disposed in a motor housing 17B. The rotation of the spindle shaft 12 can rotate the turntable 16 fixed to one end of the spindle shaft 12 outside the spindle housing 17A.

A coaxial cable 31 is routed within the spindle housing 17A for supplying a high voltage to the substrate 15 and/or the turntable 16. More specifically, the coaxial cable 31 has an inner conductor (core wire) 31A and an outer conductor 31B, and routed in a throughhole formed through the center of the spindle shaft 12. The coaxial cable 31 is supplied with a voltage from the voltage source 60 through the high voltage supplying portion 37 and a power supply cable connector 38, which is a coaxial connector.

The air bearing 14 is supplied with air for bearing through a valve (not shown) from outside the spindle housing 17A. The air circulates within the air bearing 14. This circulating air is exhausted from the spindle housing 17A to the outside of the vacuum chamber 11 through an air pipe (not shown).

Figure 3:
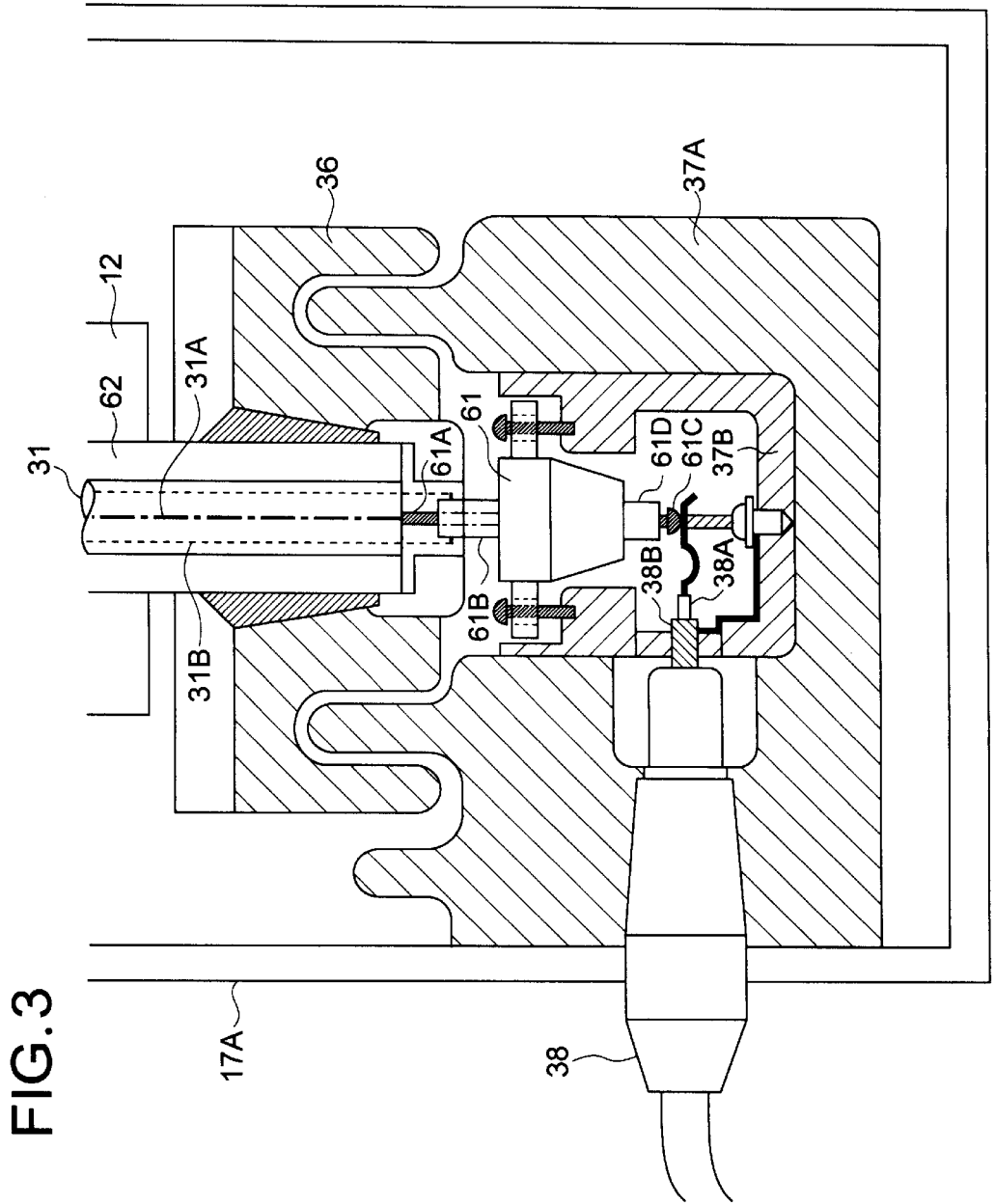
FIG. 3 is a cross-sectional view schematically illustrating a portion including the high voltage supplying portion illustrated in FIG. 2 and insulating flange S.

FIG. 3 is a cross-sectional view schematically illustrating in detail a portion including the high-voltage supplying portion 37 illustrated in FIG. 2 and an insulating flange 36. The coaxial cable 31 is insulated from the spindle shaft 12, which is at a ground potential, by a pipe 62 made of an insulating material (for example, acrylic or the like), since the coaxial cable 31 is supplied with a high voltage of several tens of kV. The coaxial cable 31 is rotated together with the spindle shaft 12. The coaxial cable 31 is supplied with a high voltage through a rotary connector 61. More specifically, an inner conductor 61A and an outer conductor 61B of a rotating portion of the rotary connector 61 are connected to the inner conductor 31A and the outer conductor 31B of the coaxial cable 31, respectively. An inner conductor 61C and an outer conductor 61D of a non-rotating portion (fixed portion) of the rotary connector 61 are connected to an inner conductor 38A and an outer conductor 38B of the power supply cable connector 38, respectively. A supporting member 37B for supporting the rotary connector 61 and the power supply cable connector 38 are insulated by an insulating member 37A. An insulating flange 36 is disposed at an end of the coaxial cable 31 within the spindle housing 17A. As illustrated in FIG. 3, the insulating flange 36 and the insulating member 37A are formed and arranged in such a manner that a creepage distance can be ensured.

Thus, the rotary connector 61 is electrically insulated from the spindle housing 17A and the spindle shaft 12, and therefore electrically insulated from the vacuum chamber 11. Consequently, a rotary connector of small and low torque loss can be used for the rotary connector 61 without the need for a connector which can withstand a high voltage of several tens of kV.

A rolling bearing is used in the rotary connector 61, and mercury is used in a connection portion of the rotating portion with the fixed portion. Alternatively, a slip ring may be used for connecting the rotating portion with the fixed portion through a brush. As an insulating material for the insulating flange 36 and the insulating member 37A, an epoxy resin or a ceramic may be used.

Therefore, the retarding voltage ($-V_R$, for example, $-40$ kV) is supplied to the inner conductor 31A of the coaxial cable 31 from the voltage source 60 through the power supply cable connector 38 and the rotary connector 61. On the other hand, a voltage ($-V_R-V_C$), which is the sum of the retarding voltage and the chucking voltage ($-V_C$, for example, $-500$ V), is supplied to the outer conductor 31B of the coaxial cable 31.

Figure 4A:
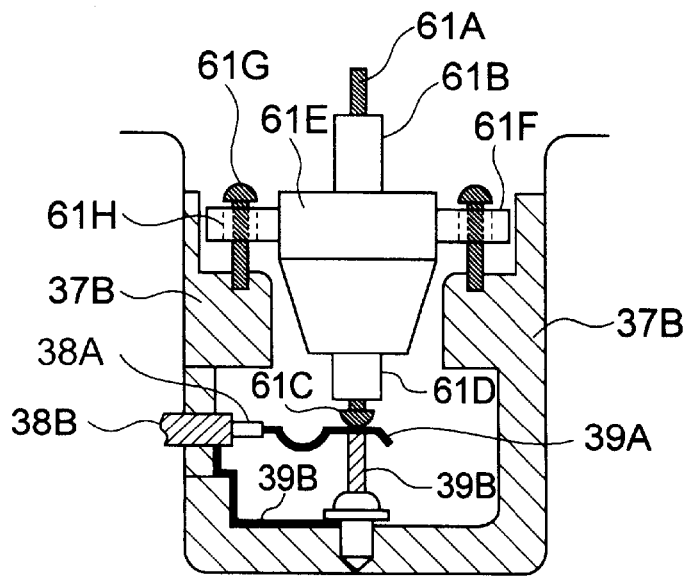
FIGS. 4A and 4B are cross-sectional views, taken in directions orthogonal to each other, illustrating in detail the structure for supporting a rotary connector and an electric connection of the rotary connector.
Figure 4B:
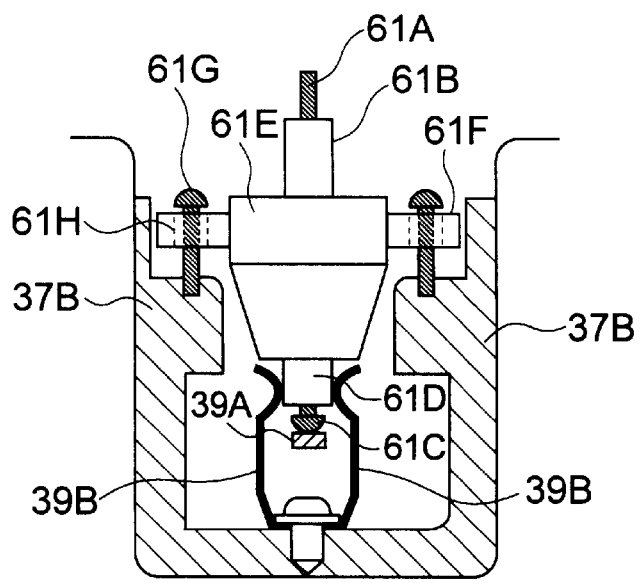
Figure 5:
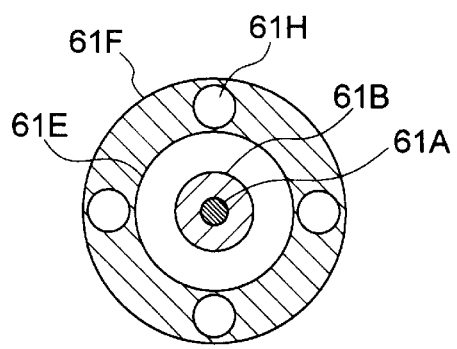
FIG. 5 is a plan view of the rotary connector when seen from a rotating portion.

As described above, while the rotary connector 61 is used for supplying a high voltage, the master manufacturing apparatus 10 of the present invention further includes a mechanism which prevents the rotation accuracy of the air spindle motor 17 from degrading due to the connection of the rotary connector 61. FIGS. 4A, 4B are cross-sectional views, taken in directions orthogonal to each other, showing in detail a supporting structure and an electric connection of the rotary encoder. FIG. 5 is a plan view when seen from the rotating portions 61A, 61B. A floating ring 61F is attached to a rotary connector body 61E, which is a non-rotating portion of the rotary connector 61. The floating ring 61F is formed with throughholes 61H for passing guide pins 61G therethrough. The floating ring 61F is guided by the guide pin 61G fixed to the rotary connector supporting member 37B. The throughhole 61H has a diameter larger than the diameter of the guide pin 61G. In other words, a gap is formed between the throughhole 61H and the guide pin 61G. The guide pin 61G has a length longer than the thickness of the floating ring 61F. Therefore, the floating ring 61F can freely move within the length of the guide pin 61G. The gap, the size of which may be for example, in a range of 0.2 to 0.3 mm, may be determined as appropriate in accordance with the types of air spindle motor and rotary connector used, performance and accuracy required for the apparatus, and so on. Thus, the rotary connector 61 can freely move within a plane perpendicular to the central axis (axis of rotation) of the spindle shaft 12 and along the central shaft within the gaps. In other words, the rotary connector 61 is supported in a floating manner. However, the floating ring 61F may not necessarily be used, but the rotary connector body 61E may be formed to have a protrusion, instead of using the floating ring 61F, to prevent the rotary connector body 61E from rotating beyond a fixed angular distance.

On the other hand, as illustrated in FIGS. 4A, 4B, the inner conductor 38A of the power supply cable connector 38 is electrically connected to the inner conductor 61C of the rotary connector 61 by a first connecting member 39A. The outer conductor 38B of the power supply cable connector 38 is electrically connected to the outer conductor 61D of the rotary connector 61 by a second connecting member 39B. The first and second connecting members 39A, 39B are formed of metal pieces or the like having a small elastic modulus such that they do not impede movements of the rotary connector 61 but properly limit vibrations of the rotary connector 61. Further, the connecting members 39A, 39B have such an elastic modulus and a contact resistance that do not cause degraded performance as contacts. For example, the first and second connecting members 39A, 39B are formed of gold-plated phosphor bronze for spring.

Figure 6:
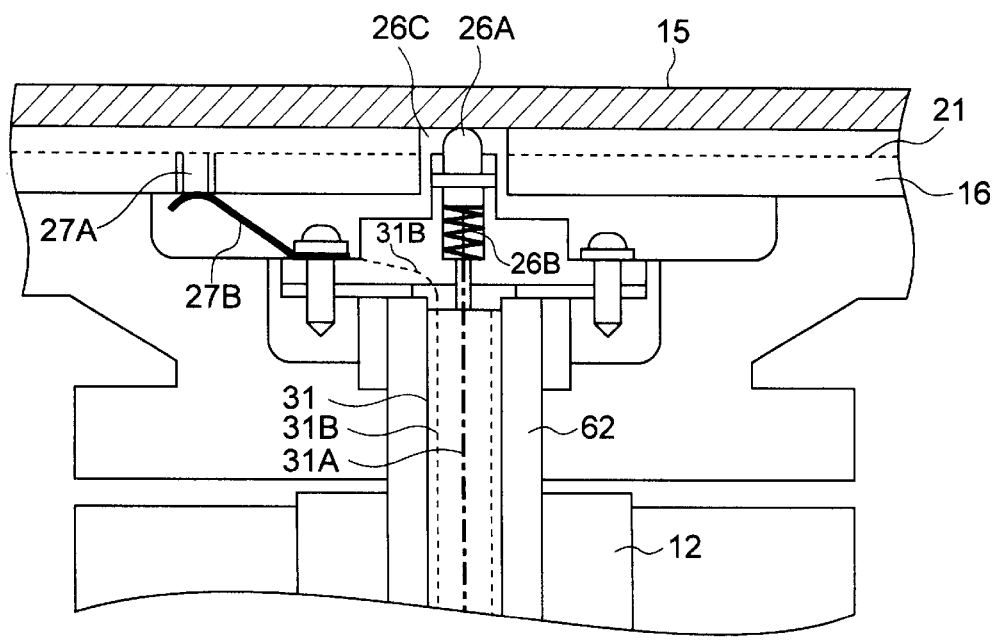
FIG. 6 is a cross-sectional view schematically illustrating in detail a central portion of a turntable.

FIG. 6 is a cross-sectional view schematically illustrating in detail a central portion of the turntable 16 of the master manufacturing apparatus 10 illustrated in FIG. 1.

As described above, during electron beam exposure, the substrate 15 supported on the turntable 16 is applied with the retarding voltage ($-V_R$) to decelerate electron rays of the electron beam incident on the substrate 15. More specifically, the retarding voltage ($-V_R$) supplied from the inner conductor 31A of the coaxial cable 31 is applied to the substrate 15 through a conductive member 26A formed of an electrically conductive material. The conductive member 26A is urged or applied with a force such that it can project and retract from a supporting surface through a throughhole 26C formed through the turntable 16. For example, the conductive member 26A is urged by an elastic member 26B such as a spring, so that the substrate 15 held on the turntable 16 is brought into press contact with the conductive member 26A to apply the retarding voltage to the substrate 15. A leading end of the conductive member 26A is formed in a smooth convex face which is in good contact with the substrate 15 at all times to apply the retarding voltage.

The substrate 15 is chucked by an electrostatic chucking mechanism and held on the turntable 16. More specifically, a voltage ($-V_R-V_C$) supplied from the outer conductor 31B of the coaxial cable 31 is applied to chucking electrodes 21 through chucking voltage conductors 27A, 27B. In other words, a negative predetermined chucking voltage ($-V_C$) relative to the potential on the substrate 15 is applied to the chucking electrodes 21 to generate electrostatic polarization on the turntable 16, resulting in generation of an electrostatic force.

As described above in detail, according to the present invention, the rotary connector 61 is used for the high voltage connection between the rotating portion and the fixed portion, and the rotary connector 61 is not grounded. Therefore, a small- and low-torque loss rotary connector can be used without the need for a connector which can withstand a high voltage. As a result, a high voltage can be supplied without degrading the rotation accuracy of the air spindle motor 17. In addition, the rotary connector 61 is supported in a floating manner, so that the high voltage can be supplied without adversely affecting the rotation accuracy of the air spindle motor 17.

With the employment of the configuration as described, the retarding voltage is applied to decelerate the electron beam, thereby making it possible to prevent a reduction of the electron-beam exposure amount for the resist layer and a degraded resolution and to perform the electron beam exposure without damaging the rotation accuracy of the substrate. Consequently, a high-density exposure can be performed in a short time and with high accuracy.

Also, the substrate 15 can be securely held on the turntable 16 even during rotation since the electrostatic chucking mechanism is employed. Thus, the mechanism makes it possible to achieve high-density exposure with high accuracy and stability. Furthermore, even a warped substrate can be flatly held on the turntable 16 over the entire surface of the substrate by the electrostatic chucking mechanism. Therefore, high-density exposure can be performed with high accuracy and the focusing stability of the electron beam can be improved.

While the foregoing embodiment has been described for the master manufacturing apparatus of the optical discs taken as an example, the present invention is not limited to the apparatus, but can be applied to an apparatus for manufacturing a magnetic disc and so on. In addition, the present invention can also be applied to a disc manufacturing apparatus for forming miniature shapes through an electron-beam direct drawing without using a resist.

Second Embodiment

Figure 7:
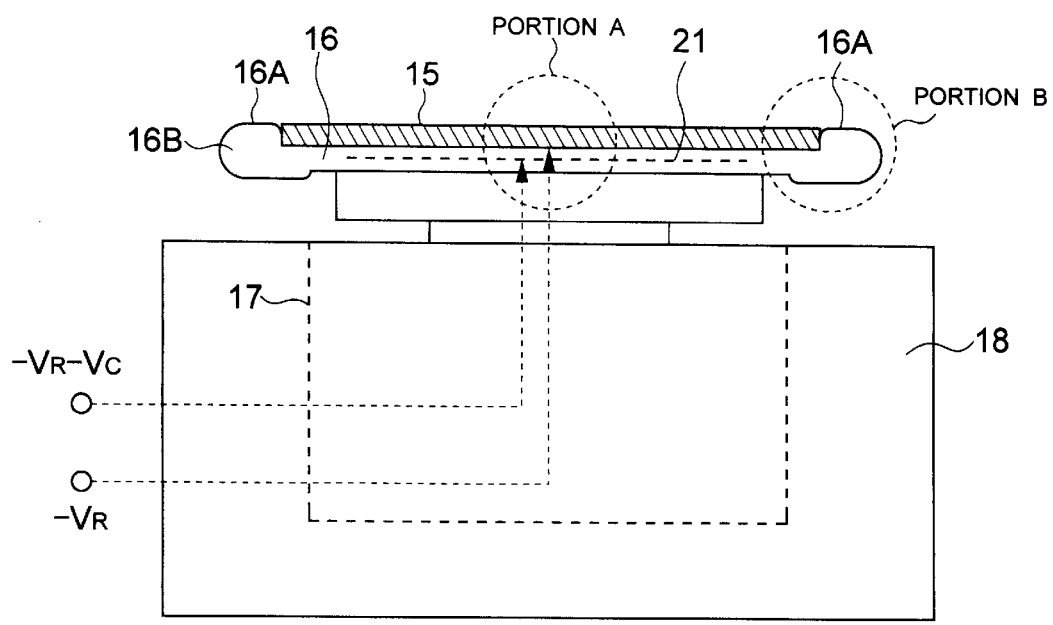
FIG. 7 is a cross-sectional view schematically illustrating the turntable and a stage of the optical master manufacturing apparatus illustrated in FIG. 1.
Figure 8:
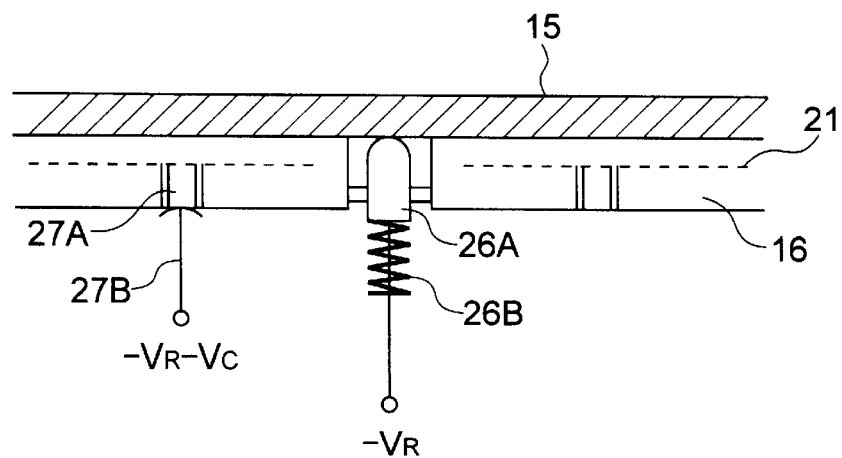
FIG. 8 is a cross-sectional view schematically illustrating the structure of a central portion (a portion A in FIG. 7) of the turntable.

A second embodiment of the present invention will be described. FIGS. 7 and 8 illustrate a mechanism for applying a retarding voltage to the substrate 15 and a chucking mechanism for chucking the substrate 15, respectively.

FIG. 7 is a cross-sectional view schematically illustrating a portion including the turntable 16 and the stage 18 of the master manufacturing apparatus 10 illustrated in FIG. 1. The turntable 16 is comprised of a ceramic substrate in which a chucking electrode 21 made of an electric conductive material is disposed for generating electrostatic polarization. The chucking electrode 21 is applied with a voltage ($-V_R-V_C$) from the voltage source 60. Specifically, a negative predetermined potential difference $V_C$ relative to a potential on the substrate 15 is applied to generate the electrostatic polarization on the ceramic, thereby attracting the substrate 15 to the turntable 16 for secure holding.

Also, the substrate 15 is applied with the retarding voltage ($-V_R$) to decelerate electron rays incident on the substrate 15 during electron beam exposure. FIG. 8 is a cross-sectional view schematically illustrating the structure of a central portion (i.e., portion A in FIG. 7) of the turntable 16. The retarding voltage ($-V_R$) is applied to the substrate 15 through a conductor 26A formed of an electrically conductive material. The conductor 26A is urged by an elastic member 26B such as a spring, so that the substrate 15 held on the turntable 16 is brought into press contact with the conductive member 26A to apply the retarding voltage to the substrate 15. A leading end of the conductive member 26A is formed in a smooth convex surface which is in contact with the substrate 15 at all times to apply the retarding voltage.

The electrode 21 is connected to conductors 27A, 27B which are applied with a chucking voltage for holding the substrate 15. The retarding voltage ($-V_R$) and the chucking voltage ($-V_C$) may be supplied in a variety of configurations, not limited to the aforementioned coaxial cable and rotary connector.

As described above, since the substrate is applied with a voltage for decelerating the electron rays during electron beam exposure, it is possible to avoid a lower resolution and achieve highly accurate exposure.

Figure 9:
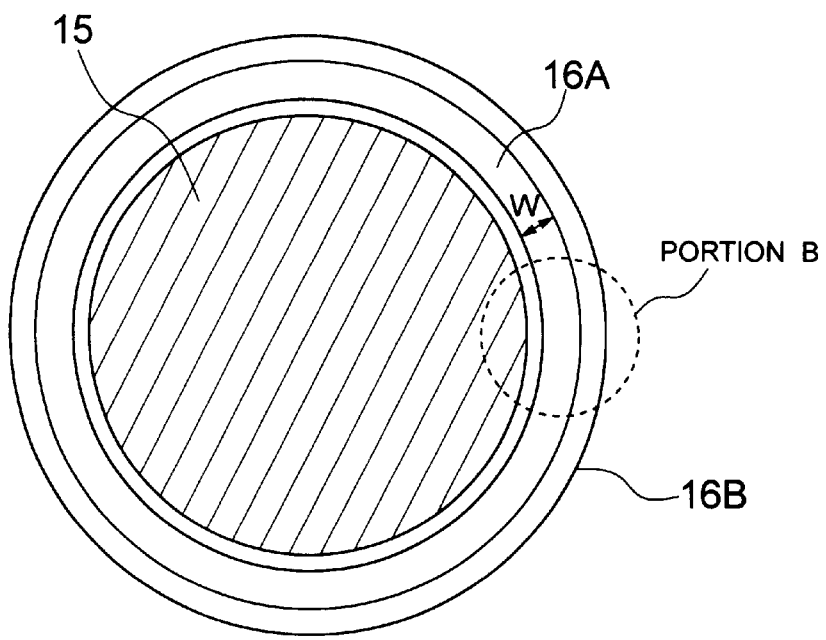
FIG. 9 is a plan view of a turntable in an optical master manufacturing apparatus according to a second embodiment of the present invention.
Figure 10:
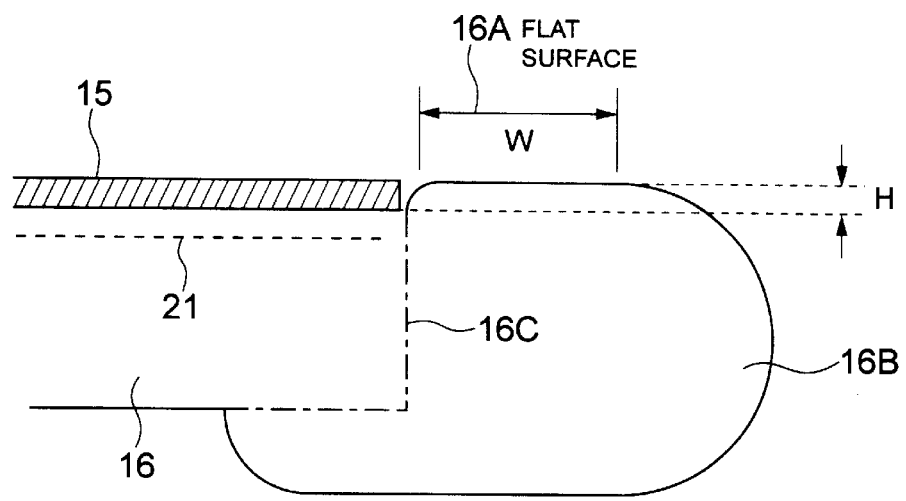
FIG. 10 is an enlarged cross-sectional view illustrating an outer peripheral portion (a portion B in FIG. 9) of the turntable.

FIG. 9 is a plan view of a turntable 16 of the master manufacturing apparatus 10. FIG. 10 is an enlarged cross-sectional view of an outer peripheral portion (i.e., portion B in FIG. 9) of the turntable 16. Specifically, FIG. 10 shows that the substrate 15 is being placed on the turntable 16.

As described above, a negative high voltage is applied to the substrate 15 in a vacuum during the electron beam exposure. Accordingly, electrons are likely to be discharged from the substrate 15. Such discharged electrons may adversely affect the exposure of a resist.

As illustrated in FIGS. 9 and 10, the turntable 16 has an outer peripheral portion 16B protruding from the substrate 15 placed thereon. The outer peripheral portion 16B has a ring-like shape, made of a material (for example, ceramic) having a low resistance value than the vacuum atmosphere during the electron beam exposure and is adhered to the body of the turntable 16 by an adhesive insulating material. Specifically, as illustrated in FIG. 10, the outer peripheral portion 16B is adhered along an adhering section 16C (indicated by a one-dot chain line). Also, the outer peripheral portion 16B has a smooth convex shape and has a flat surface 16A in a region adjacent to the outer edge of the substrate 15 which is substantially at the same level (H) as the principal surface of the substrate 15. In other words, when the substrate 15 is held on the turntable 16, the principal surface of the substrate 15 is substantially coplanar with the flat surface 16A. Further, the flat surface 16A has a predetermined width (W) in a radial direction of the substrate 15, such that a flat electric field is achieved during electron beam exposure.

The ceramic constituting the outer peripheral portion 16B has a finite resistance value, though it is an insulating material. Therefore, electrons flow from the substrate 15 to the outer peripheral portion 16B during electron beam exposure so that the electrons are less likely to be discharged into the vacuum atmosphere. This prevents electrons from leaking from the substrate 15 into the vacuum, thereby making it possible to stabilize the electron beam exposure and achieve highly accurate exposure.

While the foregoing embodiment has been described for the outer peripheral portion 16B which is adhered to the body of the turntable 16, the turntable 16B itself may be fabricated in a shape to have such an outer peripheral portion.

Third Embodiment

Figure 11:
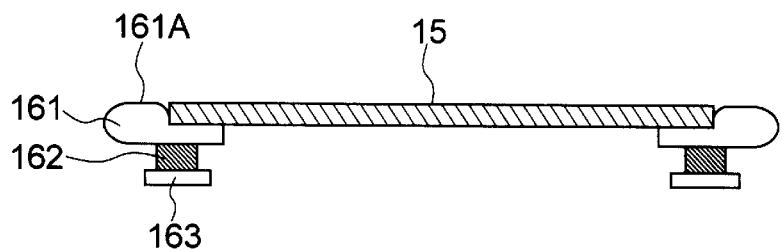
FIG. 11 is a cross-sectional view of a ring-shaped member according to a third embodiment of the present invention.
Figure 12:
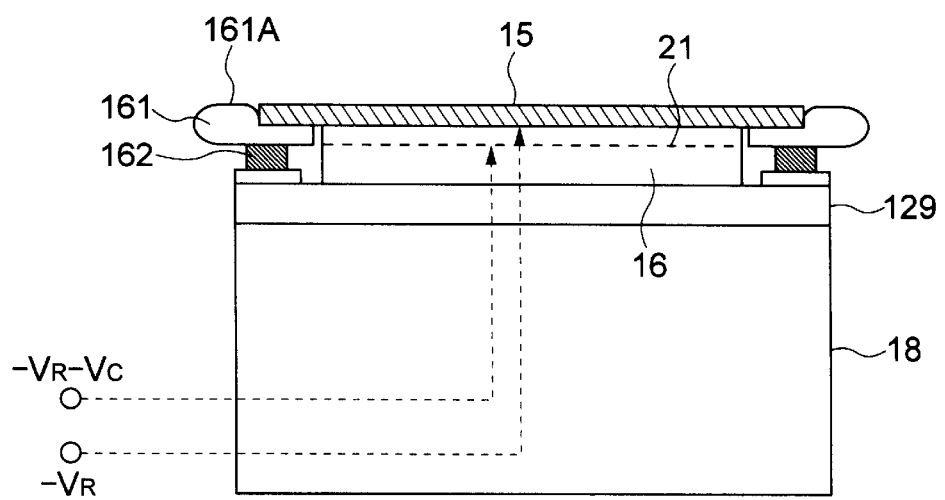
FIG. 12 is a cross-sectional view illustrating the ring-shaped member carried on a rotating portion of a spindle motor.

FIG. 11 is a cross-sectional view illustrating a ring-shaped member according to a third embodiment of the present invention. In the third embodiment, the outer peripheral portion 16B of the turntable 16 in the second embodiment is configured as a separate annular ring-shaped member 161. The ring-shaped member 161 is held by an elastic member 162 such as a spring and a holding ring 163, and is configured to serve as a transporting tray for a substrate 15. More specifically, as illustrated in FIG. 12, during electron beam exposure, the ring-shaped member 161 is carried on a rotating portion 117A of an air spindle motor 17, and attracted by an electrostatic chucking mechanism and held on the turntable 16 with the substrate 15 placed thereon, and is rotated together with the substrate 15. An insulator 117B is provided between the rotating portion 117A and the turntable 16 for electrically insulating a retarding voltage from the spindle motor 17. During electron beam exposure, a flat surface 161A of the ring-shaped member 161 is substantially coplanar with the substrate 15 to prevent electrons from leaking and to stabilize the electron beam exposure.

Similar to the second embodiment, the ring-shaped member 161 has a flat surface 161A which is substantially coplanar with the substrate 15. Also, the ring-shaped member 161 is formed of a material having a predetermined resistance value lower than the vacuum, and has a smooth convex shape.

Alternatively, the ring-shaped member 161 having the holding shape may be provided on the insulator 117B and only the substrate 15 may be transported.

Figure 13:
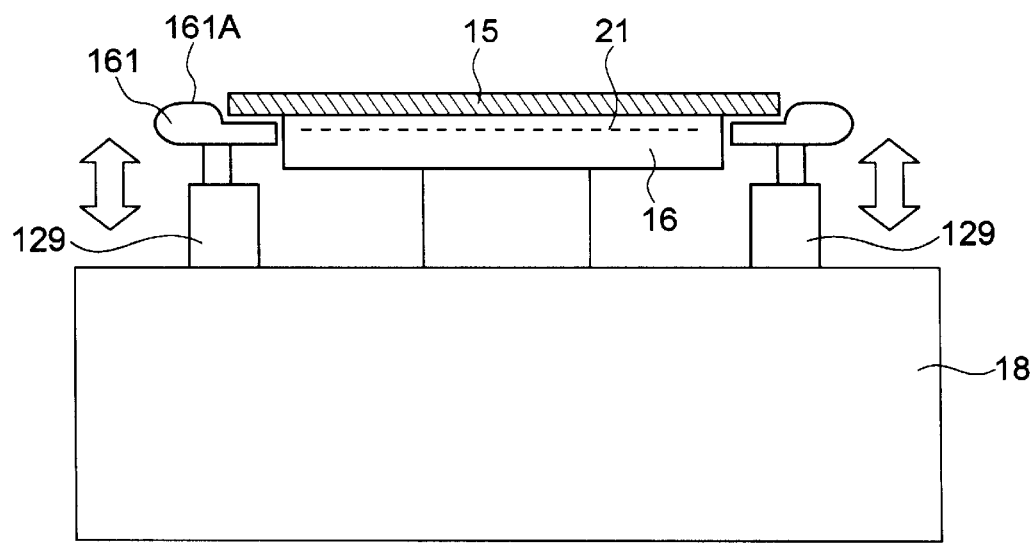
FIG. 13 is a cross-sectional view showing an exemplary modification to the third embodiment of the present invention, illustrating the ring-shaped member held by an actuator disposed on a stage, and transported to a position close to the outer peripheral edge of a substrate by the actuator during electron beam exposure.

FIG. 13 illustrates an exemplary modification to the third embodiment. The ring-shaped member 161 is held on an actuator 129 disposed on the stage 18. When electron beam exposure is performed, the ring-shaped member 161 is moved to a position near the outer peripheral edge of the substrate 15 by the actuator 129. In this event, the ring-shaped member 161 is formed such that the flat surface 161A is substantially coplanar with the substrate 15.

Figure 14:
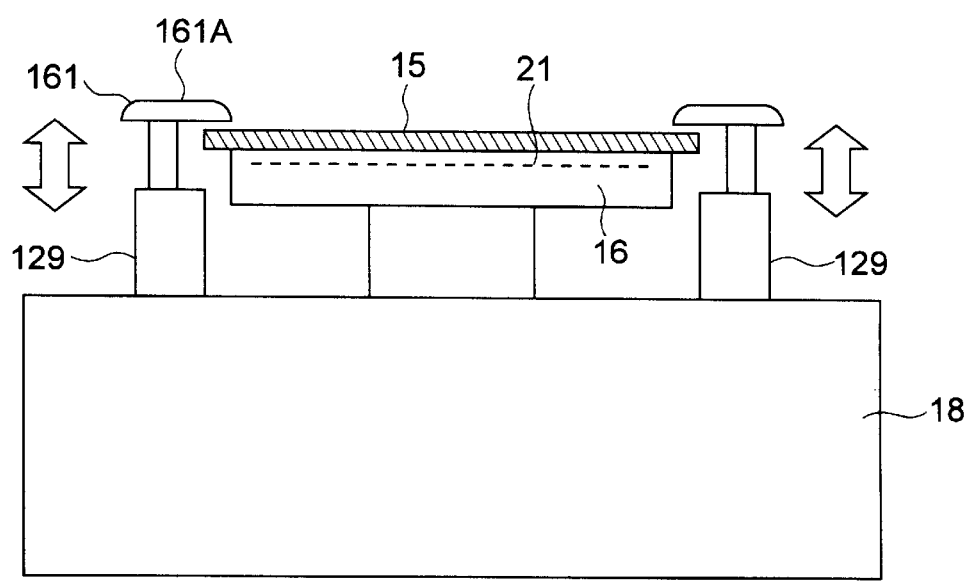
FIG. 14 is a cross-sectional view illustrating another exemplary modification of the third embodiment.
Figure 15:
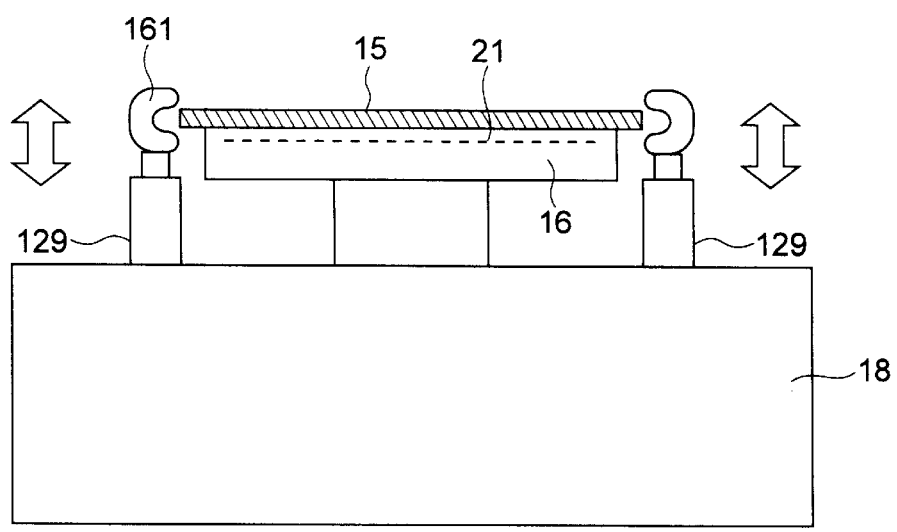
FIG. 15 is a cross-sectional view illustrating a further exemplary modification of the third embodiment.

Further, the ring-shaped member 161 is not limited to the shape or positioning as described above, but may be in any configuration as long as it can prevent electrons from leaking into the vacuum during electron beam exposure. For example, as illustrated in FIG. 14, the ring-shaped member 161 may be formed to produce a flat electric field during electron beam exposure, and configured to come close to cover a portion of an outer peripheral region of the substrate 15. Alternatively, as illustrated in FIG. 15, the ring-shaped member 161 may have an outer peripheral portion in a smooth convex shape and be configured to be positioned close to a portion of the outer periphery of the substrate 15.

As described above, the electron beam exposure can be stabilized to achieve highly accurate exposure when the retarding method is used.

Thus, according to the present invention, it is possible to avoid the resolution degradation in the electron beam exposure and to fabricate a highly accurate master.

Fourth Embodiment

In the following, a fourth embodiment of the present invention will be described with reference to the drawings.

Figure 16:
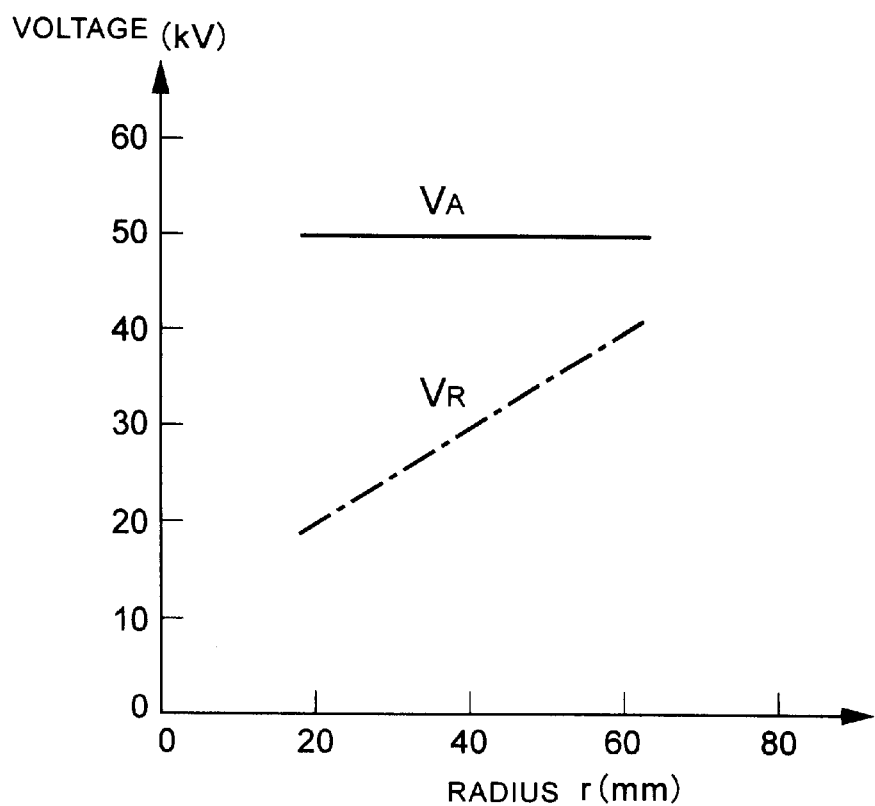
FIG. 16 is graph showing an absolute value $V_A$ of an electron beam accelerating voltage and an absolute value $V_R$ of a retarding voltage with respect to a radial position (r) of the substrate during electron beam exposure.

FIG. 16 shows an absolute value of a voltage for accelerating an electron beam ($V_A$) and an absolute value of a retarding voltage ($V_R$) during electron beam exposure with respect to a position (r) in a radial direction of the substrate 15 at which an electron beam is applied. The voltage generated by the voltage source 60 is controlled by the CPU 25. The CPU 25 also controls the driving controller 30 for spindle control such that the substrate 15 is rotated at a fixed angular velocity.

Figure 17:
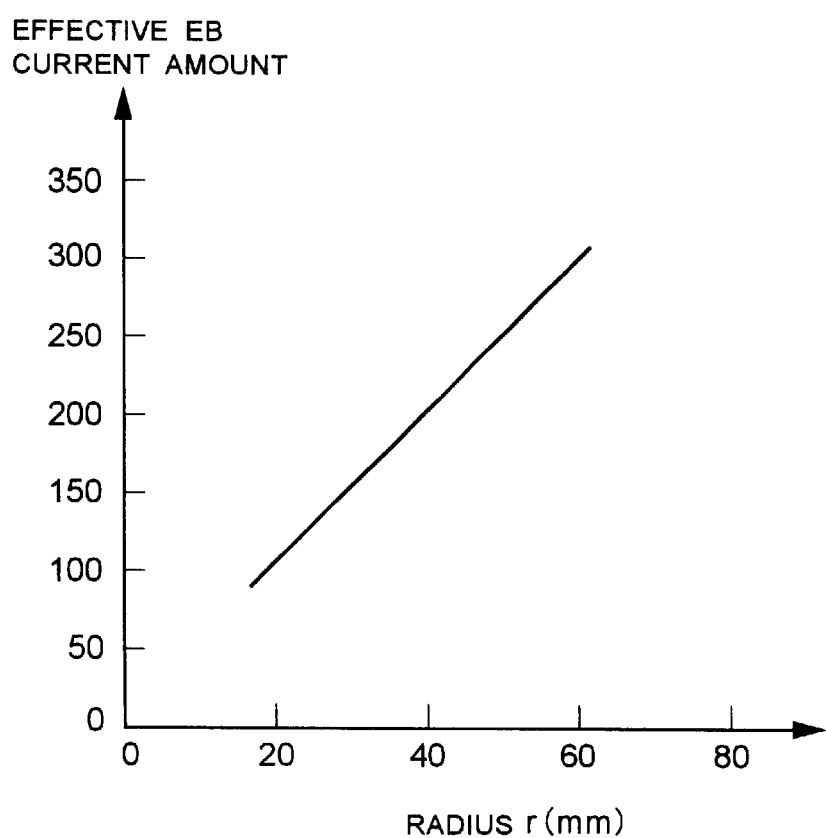
FIG. 17 is a graph showing an effective amount of electron beam current (amount of exposure) with respect to a radial position (r)

As shown in FIG. 16, the electron beam accelerating voltage ($V_A$) is held substantially constant during electron beam exposure. On the other hand, the absolute value of the retarding voltage ($V_R$) is controlled to increase as the radial position (r) irradiated with the electron beam is closer to the outer periphery. In an inner radius region of the substrate in which the line velocity is lower, the retarding voltage is set to provide an electron beam velocity in a range in which the electron beam exposure can be performed. As the radial direction (r) is closer to the outer periphery, the retarding voltage is increased. For example, when the electron beam accelerating voltage is fixed to 50 kV, the retarding voltage $V_R$ is set to 20 kV at a radial position r=20 mm in an inner radius region, while the retarding voltage $V_R$ is set to 40 kV at a radial position r=60 mm in an outer radius region. Also, the retarding voltage $V_R$ is controlled to linearly increase as the radial direction (r) is closer to the outer periphery of the substrate 15. In this way, the electron beam can be decelerated as the line velocity is increased to increase an effective amount of electron beam current. FIG. 17 shows the effective amount of electron beam current with respect to the radial position (r). As the radial position is closer to the outer periphery of the substrate (i.e., as the line velocity increases), the retarding voltage $V_R$ is increased (i.e., the effective amount of electron beam current is increased) to maintain the effective exposure amount constant irrespective of the radial position. Since the electron beam accelerating voltage is held constant, no fluctuations in resolution occur. In addition, no fluctuations occur in the electron beam axis, beam diameter or focus. It is therefore possible to perform exposure (i.e., recording) without causing variations in the pit size and the groove width.

While the embodiment has been described for an example in which the retarding voltage is linearly increased as the radial position is closer to the outer periphery of the substrate, the present invention is not limited to the embodiment. For example, the retarding voltage may be controlled such that the exposure amount of a resist by irradiation of an electron beam is kept substantially constant with respect to the radial position. Alternatively, the retarding voltage may be controlled so as to increase step-wise as the radial position (r) is increased. Further alternatively, control may be performed such that the retarding voltage in an outer radius region of the substrate is higher than the retarding voltage in an inner radius region of the substrate. In addition, these alternatives may be combined to control the retarding voltage.

The numerical values indicated in the embodiments are mere examples, and may be changed as appropriate according to the type of a master to be made, an electron beam emitting system, the substrate and the resist used in the manufacturing process, a required resolution, and so on.

According to the present invention, it is possible to realize a master manufacturing apparatus which has the advantage of simplifying the control for the disc rotation driving system, and is capable of manufacturing a high density and highly accurate master.

While the present invention has been described in the context of the master manufacturing apparatus for optical discs, the present invention is not limited to the optical master disc, but may be applied to a manufacturing apparatus of a magnetic disc master, a recording medium master and the like.

Fifth Embodiment

In the following, a fifth embodiment of the present invention will be described in detail with reference to the drawings.

Figure 18:
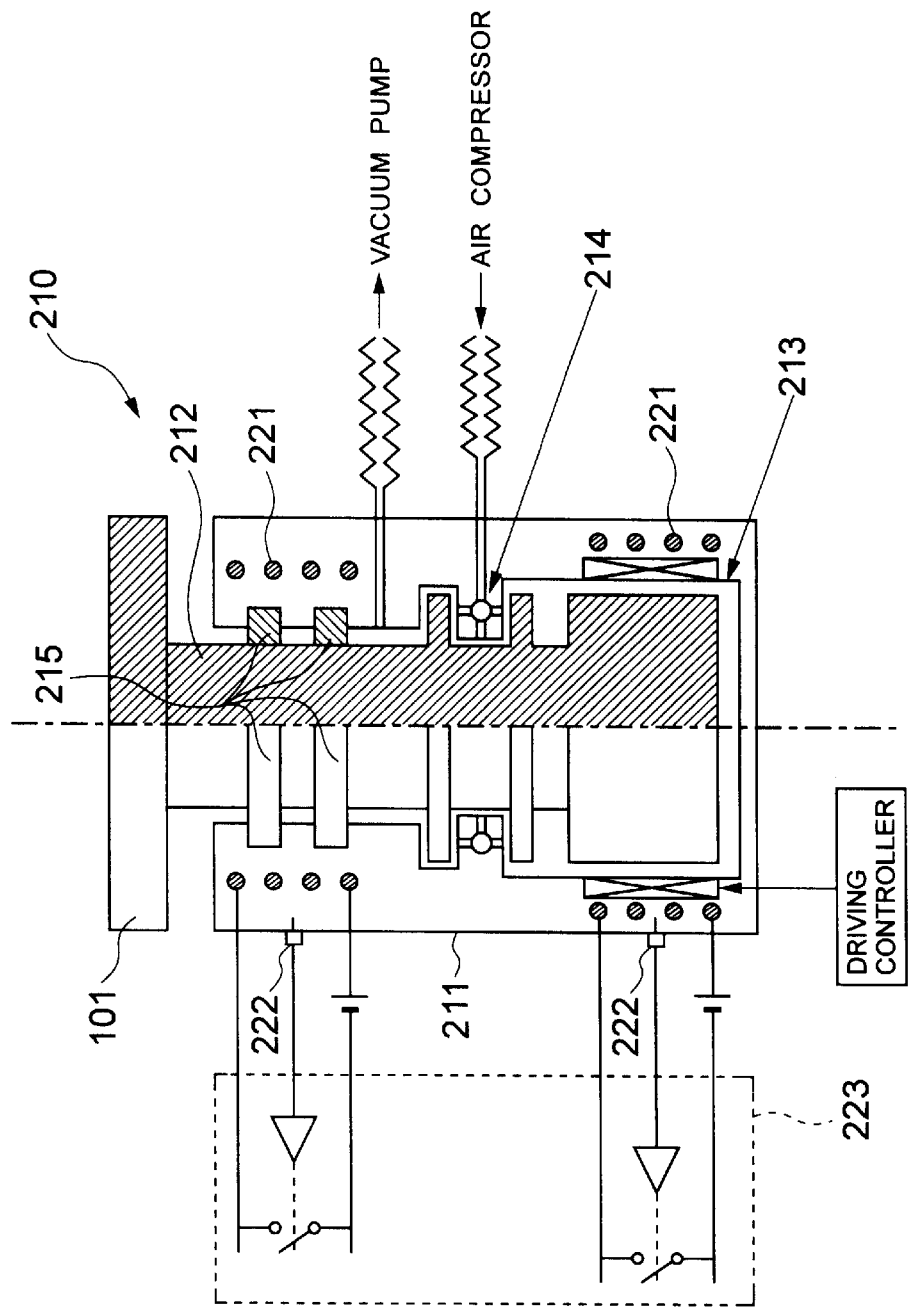
FIG. 18 is a partial cross-sectional view schematically illustrating a substrate rotating device according to a fifth embodiment of the present invention.

As illustrated in FIG. 18, a spindle shaft 212, and a motor 213 for rotating the spindle shaft are accommodated in a housing 211 of a substrate rotating device 210. The spindle shaft 212, one end of which is at least exposed from the housing 211, is rotatably supported by a static pressure air bearing 214. In this embodiment, near the end of the spindle shaft 212, a magnetic fluid seal 215 is provided to surround the spindle shaft 212 such that the magnetic fluid seal 214 interposes in a gap along a radial direction between an opening of the housing 211 and the spindle shaft 212. The magnetic fluid seal 215 serves as a airtight seal of the housing 211.

Electric heaters 221 and temperature sensors 222 which are thermocouples or the like are disposed near the magnetic fluid seal 215 and a motor 213 within a side wall of the housing 211, respectively. The heater 221 near the magnetic fluid seal 215 is incorporated to surround the annular magnetic fluid seal 215, while the heater 221 near the motor 213 is incorporated to surround a coil of the annular motor 213. Each of the temperature sensors 222 is buried deep into the side wall of the housing 211 at its position. The heaters 221 and the temperature sensors 222 are connected to a temperature controller 223 which controls the power to the heaters 221 based on the outputs of the temperature sensors 222 to control the temperatures near the magnetic fluid seal 215 and near the motor 213.

The temperature controller 223 controls the temperature of the rotating device 210 at a predetermined temperature equal to or higher than a room temperature, for example, at the highest temperature when the motor 213 continuously rotates at the highest rotational speed. For example, the temperature controller 223 detects the temperatures near the magnetic fluid seal 215 and near the motor 213 by means of the temperature sensors 222, while supplying a current to the heaters 221, to perform ON/OFF control to supply the heaters 221 with a current when the temperatures are lower than the predetermined temperature. On the other hand, the temperature controller 223 stops the current to the heaters 221 when the temperatures reaches the predetermined temperature. Alternatively, the temperature controller 223 may independently control the temperatures near the magnetic fluid seal 215 and near the motor 213. Further, in another embodiment, such temperature control may be implemented by continuously controlling the current to the heaters 221.

With the foregoing configuration, since the temperatures near the magnetic fluid seal 215 and near the motor 24 are held constant during an inoperative state, low speed rotation and high speed rotation, the rotating device 210 can be used in the same condition and therefore will not be adversely affected by a change in temperature.

The substrate rotating device having the temperature control mechanism is suitable for use in a vacuum environment within a vacuum chamber. Specifically, under the vacuum environment, a problem associated with piping will arise when a cooling fluid such as water is used for maintaining the temperature constant, and a cooling fan cannot either used for this purpose. In addition, the cooling fluid and the cooling fan would encounter difficulties in achieving correct temperature control.

While the example of the substrate rotating device has shown the structure in which the heaters 221 and the temperature sensors 222 are incorporated within the housing, they may be disposed outside of and in contact with the outer surface of the housing 211.

Description will be made on a master manufacturing apparatus using the foregoing substrate rotating device.

Figure 20:
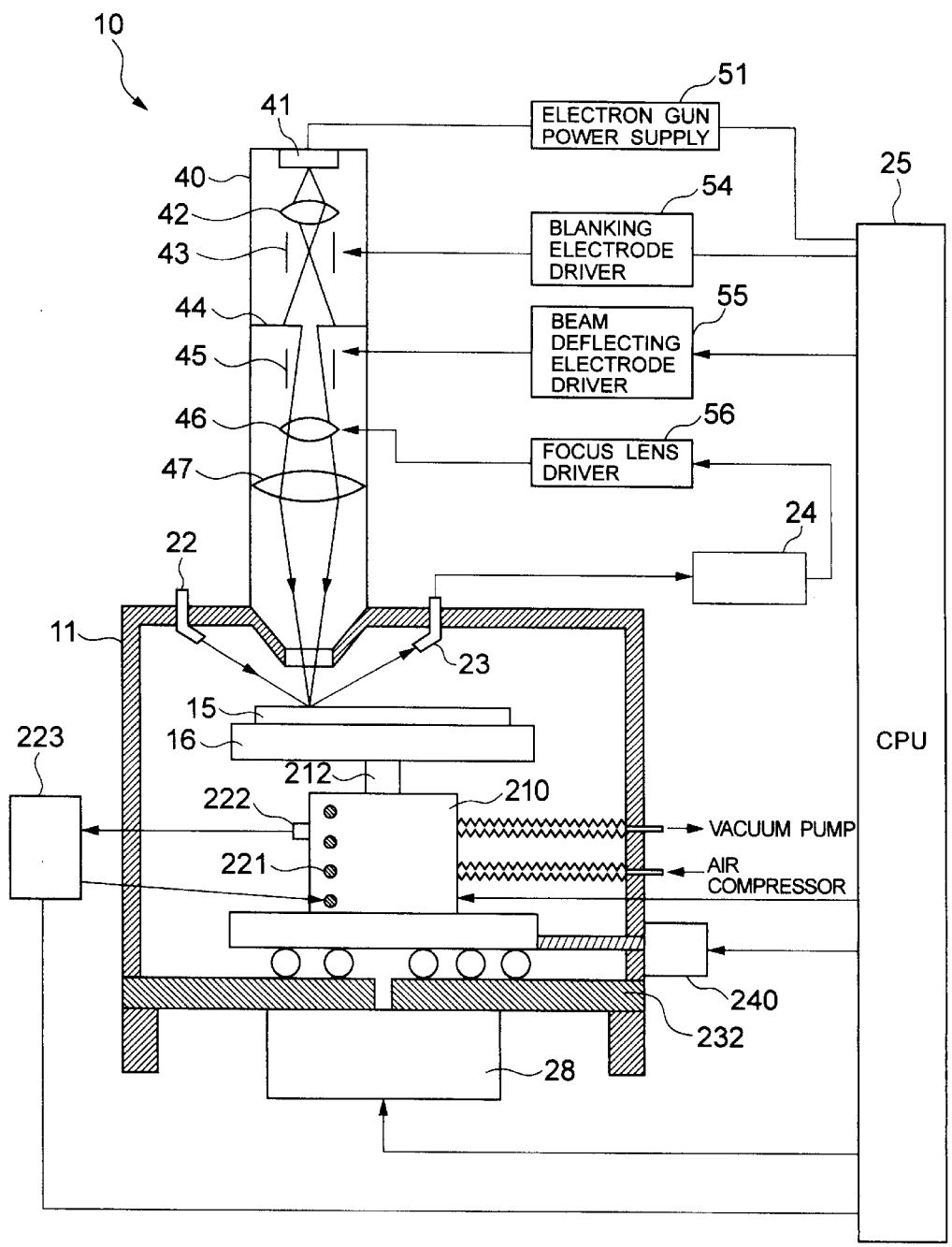
FIG. 20 is a partial cross-sectional view schematically illustrating a substrate rotating device having a temperature control mechanism according to a seventh embodiment of the present invention which is used in a master manufacturing apparatus using an electron beam.

As illustrated in FIG. 20, a master manufacturing apparatus 10 comprises a vacuum chamber 11; a substrate rotating device 210 having a turntable 16 for rotating a substrate 15 placed within the vacuum chamber; a substrate movement driving unit 240 for moving the substrate rotating device in a radial direction of the substrate; and an electron-beam emitting head attached on the vacuum chamber 11. The electron-beam emitting head 40 comprises an electron gun cylinder 48 formed with an electron beam emitting port at one end, and a controller for controlling respective components of the electron-beam emitting head 40.

The electron-beam emitting head 40 is fixed vertically to the vacuum chamber 11 such that its electron beam emitting port is inserted into the vacuum chamber 11. Specifically, the electron-beam emitting head 40 is attached on the ceiling surface of the vacuum chamber 11 with the electron beam emitting port facing the space in the vacuum chamber 11. The electron beam emitting port is positioned opposite to and proximate to the substrate 15 positioned on the turntable 16 of the substrate rotating device 10.

The electron-beam emitting head 40 comprises, as its components, an electron gun 41, a converging lens 42, blanking electrodes 43, an aperture 44, beam deflecting electrodes 45, a focus adjusting lens 46, and an objective lens 47 arranged from the opposite side of the electron beam emitting port within the cylinder, and contained therein in this order.

Figure 19:
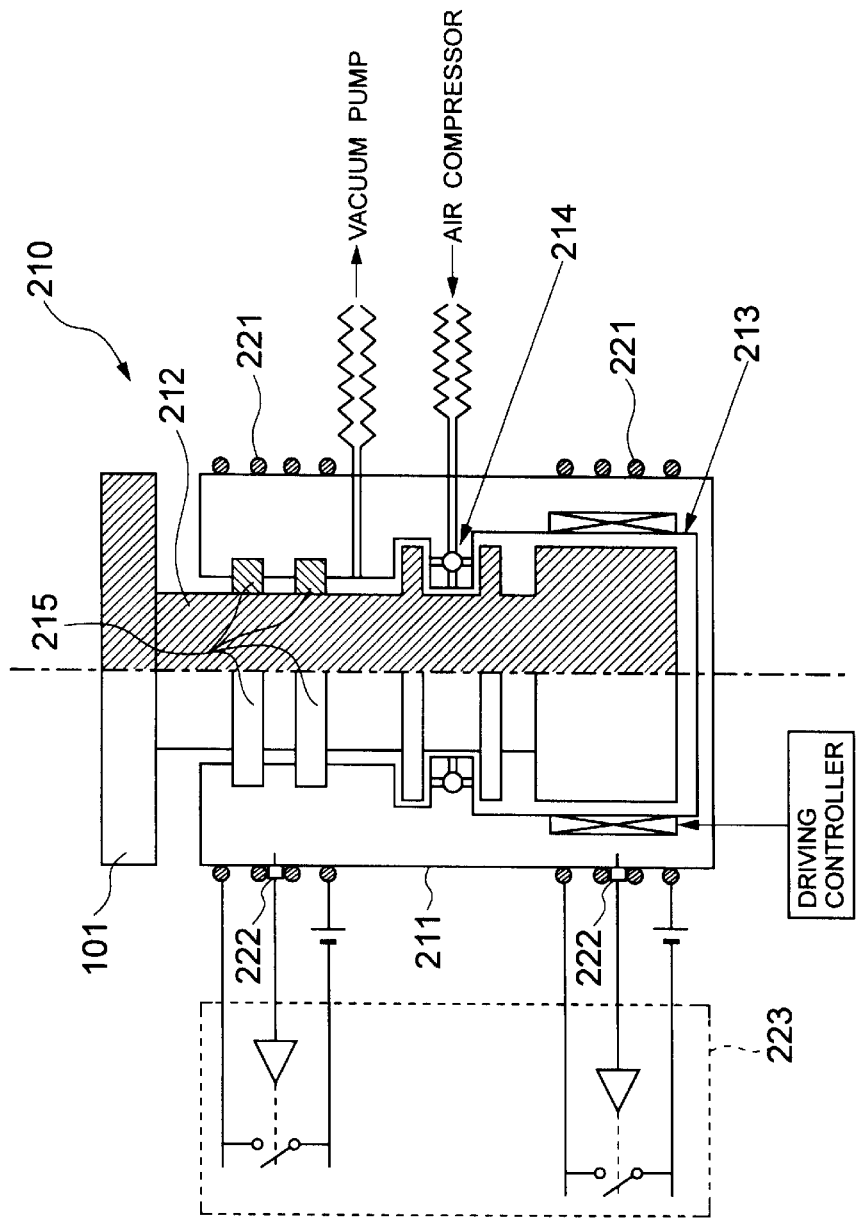
FIG. 19 is a partial cross-sectional view schematically illustrating a substrate rotating device according to a sixth embodiment of the present invention.

The substrate rotating device having a temperature control mechanism illustrated in FIG. 19 is used in the substrate rotating device 210 in the master manufacturing apparatus 10 of FIG. 20. Specifically, the heaters 221 and temperature sensors 222 are disposed near the magnetic fluid seal and the motor within the housing of the rotating device, and the temperature controller 223 performs the temperature control. In this way, it is possible to suppress fluctuations in the focus of a recording beam, jitter in a recording signal, and variations in the recording track pitch caused by the substrate rotating device.

The vacuum chamber 11 is installed by way of a vibration isolator 232 such as an air damper to suppress transmission of external vibrations. Also, the vacuum chamber 11 is connected to a vacuum pump 28 which evacuates the vacuum chamber 11 such that the chamber is set in a vacuum of a predetermined pressure.

The substrate rotating device 210 having the turntable 16 fixed to an end of the spindle shaft 212, is supported by a substrate moving unit 240 for movement in the horizontal direction.

The turntable 16 has a substrate 15 positioned thereon by either a vacuum chucking mechanism or a mechanical chucking mechanism or an electrostatic chucking mechanism, all not shown.

The controller for controlling respective components of the electron-beam emitting head 40 comprises a blanking electrode driving unit 54 for adjusting and driving the blanking electrodes; a beam deflecting electrode driving unit 55 for adjusting and driving the beam deflecting electrodes; a focus lens driving unit 56 for adjusting and driving the focus adjusting lens 46; and a main controller (CPU) 25 for controlling the driving units.

With the power supplied from an electron gun power supply 51 under control of the CPU 25, the electron gun 41 accelerates electrons discharged from a cathode with a high voltage of approximately 10 KV to several tens of KeV by an anode to emit an electron beam. The converging lens 42 converges the emitted electron beam and guids the converged electron beam to the aperture 44. The blanking electrodes 43 perform ON/OFF control for the emission of the electron beam.

The blanking electrode driving unit 54, responsive to a control signal supplied from the CPU 25, applies a voltage across the blanking electrodes 43 to greatly deflect the electron beam passing therethrough. In this way, the electron beam is not converged within the aperture 44, i.e., blocked to pass through the aperture 44, so that the electron beam is controlled to be off.

The beam deflecting electrode driving unit 55, responsive to a control signal supplied from the CPU 25, applies a voltage across the electrodes 45 to deflect the electron beam passing therethrough. In this way, the beam deflecting electrode driving unit 55 controls the position of an electron beam spot on a predetermined position of the substrate 15.

The focus lens driving unit 56, responsive to a control signal from a level measuring unit 24, adjusts the focus of a beam spot of the electron beam irradiating the principal surface of the substrate 15. The level measuring unit 24 receives light emitted from a light source 22 and reflected off the surface of the substrate 15 with a detector 23 (a position sensor, CCD or the like), and detects the level of the principal surface of the substrate based on the output of the detector 23.

The CPU 25 supplies a variety of control signals not only to respective components of the electron-beam emitting head but also to the substrate rotating device 210, the substrate movement driving unit 240, the vacuum pump 28, the temperature controller 223.

A master is fabricated using the foregoing master manufacturing apparatus 10 generally in the following procedure. A substrate is mounted on the turntable of the master manufacturing apparatus, and a predetermined pressure is created in the apparatus. The substrate is comprised of a glass plate, and an electron beam resist layer coated on the plate in a predetermined thickness by a spin coating method or the like.

The principal surface of the substrate is applied with an electron beam modulated by an information signal, while the substrate is rotated, to form a latent image having miniature concave/convex patterns such as pits and grooves spirally or concentrically arranged on the substrate.

The substrate undergoes development after completion of cutting to remove a portion of the resist layer which has been exposed to the electron beam, thereby forming miniature concave/convex patterns to fabricate a master disc on which information is recorded. The substrate, on which the miniature concave/convex patterns have been formed, is formed with a conductive film on the surface thereof. The substrate undergoes an electroforming process. Thus, a master (or a stamper) is fabricated.

According to the present invention, a certain degree of heat is supplied to the substrate rotating device beyond heat normally generated from the magnetic fluid seal and the motor. Variations of temperature distribution can be suppressed within the magnetic fluid seal by controlling the supplied heat, thereby stabilizing the rotation of the spindle shaft. In addition, the dimensions of peripheral parts such as the shaft length of the spindle, and the positional relationship remain constant, thereby making it possible to maintain stable focusing performance.

While the foregoing embodiment has been described for a master manufacturing apparatus of an optical disc taken as an example, the present invention is not limited to the apparatus but may be applied to an apparatus for manufacturing a magnetic disc or the like. Also, the present invention can also be applied to a disc manufacturing apparatus which forms miniature shapes by electron beam direct drawing without using a resist.

As will be apparent from the foregoing, the present invention can provide a highly accurate substrate rotating device and a master manufacturing apparatus and a method which are capable of manufacturing a highly-accurate and high-density master.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Applications No. 2000-266578, No. 2000-280304, No. 2001-222606, No. 2001-222607 and No. 2001-226299 which are hereby incorporated by reference.

What is claimed is:

1. An apparatus for manufacturing a master of a recording medium by irradiation of an electron beam on a substrate placed on a turntable disposed within a chamber, comprising:

an electron-beam emitting portion for emitting said electron beam;

an electron-beam converging portion for converging said electron beam to form a beam spot on said substrate;

a moving portion for moving said substrate relative to said beam spot;

a retarding voltage applying portion for applying said substrate with a retarding voltage having a magnitude for decelerating electron rays of said electron beam based upon a moving speed of said beam spot on said substrate; and a vacuum atmosphere producing portion for evacuating said chamber to produce a vacuum atmosphere therein.

2. An apparatus for manufacturing a master of a recording medium by irradiation of an electron beam on a substrate, comprising:

an electron-beam emitting portion for emitting said electron beam;

an insulating turntable for supporting said substrate on a supporting surface thereof, said turntable having a throughhole;

a spindle housing;

a spindle shaft rotatably supported by said spindle housing through an air bearing, and having one end fixed to said turntable;

a motor for rotating said spindle shaft; and an electron beam decelerating portion for applying said substrate with a retarding voltage of a magnitude of decelerating said electron beam, wherein said electron beam decelerating portion includes a conductive member which is urged such that said conductive member can project and retract from and into said supporting surface through the through hole of said turntable, and a relay portion for relaying said retarding voltage to said conductive member through a rotary connector.

3. A manufacturing apparatus according to claim 2, further comprising a translation driving portion for translating said turntable relative to said electron-beam emitting portion.

4. A manufacturing apparatus according to claim 2, wherein said relay portion comprises an insulating pipe extending through said spindle shaft which is hollow, and a high voltage cable inserted through said insulating pipe.

5. A manufacturing apparatus according to claim 2, wherein said conductive member is urged by an elastic member.

6. A manufacturing apparatus according to claim 2, wherein said rotary connector is insulated from a ground potential.

7. A manufacturing apparatus according to claim 2, wherein said spindle shaft is grounded through a conductive magnetic-fluid seal intervening between said spindle housing and said spindle shaft, and said rotary connector is insulated from said spindle shaft and said spindle housing.

8. A substrate rotating device comprising:
   an insulating turntable for carrying a substrate thereon;
   a spindle housing;
   a spindle shaft rotatably supported by said spindle housing through an air bearing and having one end fixed to said turntable;
   a motor for rotating said spindle shaft; and
   an electrostatic chucking portion for attracting said substrate to said turntable,
   wherein said electrostatic chucking portion includes a chucking electrode disposed in said turntable, a power supply cable for supplying a chucking voltage to said chucking electrode through said spindle shaft, and a rotary connector for supplying said chucking voltage to said power supply cable.

9. A substrate rotating device according to claim 8, wherein said rotary connector has a rotating portion fixed to said power supply cable, and a fixed portion supported by a static insulating member in a floating manner.

10. An apparatus for manufacturing a master of a recording medium by irradiation of an electron beam on a substrate, comprising:
    an electron-beam emitting portion for emitting said electron beam;
    a substrate rotating device including an insulating turntable for supporting said substrate on a supporting surface thereof; said turntable having a throughhole, a spindle housing, a spindle shaft rotatably supported by said spindle housing through an air bearing and having one end fixed to said turntable, and a motor for rotating said spindle shaft;
    a translation driving portion for translating said rotation driving portion relative to said electron-beam emitting portion; and
    an electrostatic chucking portion for attracting said substrate to said turntable,
    wherein said electrostatic chucking portion includes a chucking electrode disposed in said turntable, a power supply cable installed in said spindle shaft for supplying a chucking voltage to said chucking electrode, and a rotary connector for supplying said chucking voltage to said power supply cable.

11. An apparatus according to claim 10, further comprising an electron beam decelerating portion for applying said substrate with a retarding voltage of a magnitude of decelerating electron rays of said electron beam, wherein said power supply cable includes an inner conductor and an outer conductor, and said chucking voltage is supplied through said rotary connector and said external conductor, while said retarding voltage is supplied through said rotary connector and said inner conductor.

12. An apparatus according to claim 10, wherein said rotary connector has a rotating portion fixed to said power supply cable, and a fixed portion supported by a static insulating member in a floating manner.

13. An apparatus according to claim 10, wherein said rotary connector is insulated from a ground potential.

14. An apparatus according to claim 10, wherein said spindle shaft is grounded through a conductive magnetic-fluid seal intervening between said spindle housing and said spindle shaft, and said rotary connector is insulated from said spindle shaft and said spindle housing.

15. An apparatus for manufacturing a master of a recording medium by irradiation of an electron beam on a substrate placed on a turntable disposed in a chamber, comprising:
    an electron beam emitting portion for emitting said electron beam;
    an electron beam converging portion for converging said electron beam;
    an electron beam decelerating portion for applying said substrate with a retarding voltage of a magnitude of decelerating said electron beam; and
    a vacuum atmosphere producing portion for evacuating said chamber to produce a vacuum atmosphere therein,
    wherein said turntable has an adjacent region adjacent to an outer edge of said substrate placed on said turntable and said adjacent region has a predetermined resistance value lower than said vacuum atmosphere.

16. A manufacturing apparatus according to claim 15, wherein said adjacent region has a flat surface substantially at the same level as a principal surface of the placed substrate.

17. A manufacturing apparatus according to claim 15, wherein said turntable includes an outer peripheral portion of a smooth convex shape.

18. An apparatus for manufacturing a master of recording medium by irradiation of an electron beam on a substrate placed on a turntable disposed in a chamber, comprising:
    an electron-beam emitting portion for emitting said electron beam;
    an electron-beam converging portion for converging said electron beam;
    a retarding voltage applying portion for applying said substrate with a retarding voltage of a magnitude of decelerating said electron beam;
    a vacuum atmosphere producing portion for evacuating said chamber to produce a vacuum atmosphere therein; and
    an adjacent ring having a predetermined resistance value lower than said vacuum atmosphere and adjoining to said substrate placed on said turntable.

19. A manufacturing apparatus according to claim 18, wherein said adjacent ring has a flat plane substantially at the same level as a principal surface of the placed substrate.

20. A manufacturing apparatus according to claim 18, wherein said adjacent ring has an outer peripheral portion of a smooth convex shape.

21. A manufacturing apparatus according to claim 18, further comprising a transporting portion for transporting said adjacent ring to a position adjacent to said substrate.

22. A method of manufacturing a master of a recording medium by irradiation of an electron beam on a substrate placed on a turntable disposed in a chamber, comprising:
    evacuating said chamber to a vacuum;
    converging said electron beam so as to form a beam spot on said substrate;
    moving said substrate relative to said beam spot; and
    applying a substrate placed on said turntable with a retarding voltage of a magnitude for decelerating said electron beam based upon a moving speed of said beam spot on said substrate.

23. An apparatus for manufacturing a master by irradiation of an electron beam on a substrate having a resist formed on a principal surface thereof, comprising:

an electron gun;

an accelerating voltage applying portion for applying said electron gun with an accelerating voltage to emit an electron beam;

a rotation driving portion for rotating said substrate substantially at a constant angular velocity;

a movement driving portion for relatively moving an irradiation position of said electron beam in a rotational radial direction of said substrate;

an electron beam decelerating portion for applying said substrate with a retarding voltage having a magnitude of decelerating electron rays of said electron beam; and a controller for varying said electron beam retarding voltage in accordance with the irradiation position of said electron beam in the rotational radial direction of said substrate while maintaining said accelerating voltage substantially constant.

24. An apparatus according to claim 23, wherein said controller controls said electron beam decelerating portion to generate said electron beam retarding voltage higher in an outer radius region of said substrate than in an inner radius region of said substrate.

25. An apparatus according to claim 23, wherein said controller controls said electron beam decelerating portion to increase said electron beam retarding voltage as the radial distance form the center of rotation of said substrate increases.

26. An apparatus according to claim 23, wherein said controller controls said electron beam retarding voltage such that the exposure amount of said resist by said electron beam is maintained substantially constant irrespective of the irradiation position of said electron beam.

27. An apparatus according to claim 23, further comprising a vacuum atmosphere producing portion for producing a vacuum to place said substrate, said rotation driving portion and said movement driving portion in a vacuum atmosphere.

28. A substrate rotating device comprising a housing, a spindle shaft accommodated in said housing with one end thereof exposed from said housing, said spindle shaft being rotatably supported by a bearing, a motor for driving said spindle shaft, and a magnetic fluid seal intervening between said housing and said spindle shaft, said substrate rotating device for use in a vacuum atmosphere, comprising:

temperature sensors and electric heaters disposed near said magnetic fluid seal and said motor; and a temperature controller for controlling said electric heaters based on outputs of said temperature sensors.

29. A substrate rotating device according to claim 28, wherein said temperature controller controls said electric heaters such that the temperatures at said magnetic fluid seal and said motor are at predetermined temperatures when said motor continues to rotate at a predetermined rotational speed.

30. A substrate rotating device according to claim 28, wherein said temperature sensors and said electric heaters are disposed within a side wall of said housing.

31. A substrate rotating device according to claim 28, wherein said temperature sensors and said electric heaters are disposed external to and in contact with said housing.

32. A master manufacturing apparatus using a substrate comprising:

a substrate rotating device for rotating said substrate;

an electron beam emitting portion including a deflecting portion for controlling deflection of an electron beam and a focus control portion for converging said electron beam to irradiate a principal surface of said substrate with the converged electron beam; and a movement driving portion for relatively moving said substrate rotating device and said electron beam emitting portion in a radial direction of said substrate, wherein said substrate rotating device has a housing; a spindle shaft accommodated in said housing with at least one end thereof exposed from said housing and rotatably supported by a static pressure air bearing; a motor for rotating said spindle shaft; a magnetic fluid seal intervening in a gap between said housing and said spindle shaft; temperature sensors and electric heaters disposed near said magnetic fluid seal and said motor; and a temperature controller for controlling said electric heaters based on the outputs of said temperature sensors.

33. A master manufacturing apparatus according to claim 32, wherein said temperature controller controls said electric heaters such that temperatures of said magnetic fluid seal and said motor are at predetermined temperatures when said motor continues to rotate at a predetermined rotational speed.

34. A master manufacturing apparatus according to claim 32, further comprising a vacuum atmosphere producing portion for producing a vacuum to place said electron beam emitting portion and said movement driving portion in a vacuum atmosphere.

35. A master manufacturing apparatus according to claim 32, wherein said temperature sensors and said electric heaters are disposed within a side wall of said housing.

36. A master manufacturing apparatus according to claim 32, wherein said temperature sensors and said electric heaters are disposed external to and in contact with said housing.

* * * * *